US012749519B2

(12) United States Patent
Katayama

(10) Patent No.: US 12,749,519 B2
(45) Date of Patent: Sep. 29, 2026

(54) MULTILEVEL ANTIFERROMAGNETIC MEMORY DEVICE

(71) Applicant: KIOXIA CORPORATION, Tokyo (JP)

(72) Inventor: Akira Katayama, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 403 days.

(21) Appl. No.: 17/898,913

(22) Filed: Aug. 30, 2022

(65) Prior Publication Data

US 2023/0290397 A1 Sep. 14, 2023

(30) Foreign Application Priority Data

Mar. 11, 2022 (JP) ................................ 2022-038263

(51) Int. Cl.
*G11C 11/16* (2006.01)
*H10B 61/00* (2023.01)
(Continued)

(52) U.S. Cl.
CPC ........ *G11C 11/161* (2013.01); *G11C 11/1655* (2013.01); *G11C 11/1657* (2013.01);
(Continued)

(58) Field of Classification Search
CPC .............. G11C 11/161; G11C 11/1655; G11C 11/1657; G11C 11/1675; G11C 11/1673;
(Continued)

(56) References Cited

U.S. PATENT DOCUMENTS 6,829,162 B2 12/2004 Hosotani
7,166,881 B2 * 1/2007 Lin ........................ H10B 61/22 257/E27.005
(Continued)

FOREIGN PATENT DOCUMENTS

JP 3866567 B2 1/2007
JP 5490167 B2 5/2014
JP 2021-144969 A 9/2021

OTHER PUBLICATIONS

Kim et al., "Bipolar resistive switching characteristics in tantalum nitride-based resistive random access memory devices," Appl. Phys. Lett. 106, 203101 (2015).*

*Primary Examiner* — Allison Bernstein
(74) *Attorney, Agent, or Firm* — Kim & Stewart LLP

(57) ABSTRACT

A memory device includes a first conductor, a first stacked body on the first conductor, a second conductor on the first stacked body, a second stacked body on the second conductor, and a third conductor on the second stacked body. The first stacked body includes a first ferromagnetic layer, a first insulating layer, a second ferromagnetic layer, a non-magnetic first metal layer, and a third ferromagnetic layer stacked in order from a side of the first conductor. The second and third ferromagnetic layers have magnetizations in opposite directions. The second stacked body includes a fourth ferromagnetic layer, a second insulating layer, a fifth ferromagnetic layer, a non-magnetic second metal layer, and a sixth ferromagnetic layer stacked in order from a side of the second conductor. The fifth and sixth ferromagnetic layers have magnetizations in opposite directions. The sixth ferromagnetic layer has a larger volume than the third ferromagnetic layer.

19 Claims, 17 Drawing Sheets

(51) Int. Cl.
*H10N 50/10* (2023.01)
*H10N 50/80* (2023.01)

(52) U.S. Cl.
CPC ...... *G11C 11/1673* (2013.01); *G11C 11/1675* (2013.01); *H10B 61/22* (2023.02); *H10N 50/10* (2023.02); *H10N 50/80* (2023.02)

(58) Field of Classification Search
CPC .... G11C 11/1659; H10B 61/22; H10B 61/10; H10N 50/80; H10N 50/10
USPC .......................................................... 365/158
See application file for complete search history.

(56) References Cited

U.S. PATENT DOCUMENTS

| | | | | |
|---|---|---|---|---|
| 9,343,129 | B2 | 5/2016 | Shimomura | |
| 9,741,764 | B1 * | 8/2017 | Terai | H10B 63/24 |
| 10,403,343 | B2 * | 9/2019 | Bozdag | H10N 50/10 |
| 10,854,252 | B2 * | 12/2020 | Nagase | G11C 11/1673 |
| 11,094,359 | B2 * | 8/2021 | Bozdag | H10N 50/85 |
| 11,222,678 | B1 * | 1/2022 | Parkinson | G11C 11/1675 |
| 2021/0288240 | A1 | 9/2021 | Sawada et al. | |

* cited by examiner

MULTILEVEL ANTIFERROMAGNETIC MEMORY DEVICE

CROSS-REFERENCE TO RELATED APPLICATION

This application is based upon and claims the benefit of priority from Japanese Patent Application No. 2022-038263, filed Mar. 11, 2022, the entire contents of which are incorporated herein by reference.

FIELD

Embodiments described herein relate generally to a memory device.

BACKGROUND

A memory device that stores data using an element having a variable resistance is known. The memory device is required to have both high storage capacity and high data reading performance.

DETAILED DESCRIPTION

Figure 1:
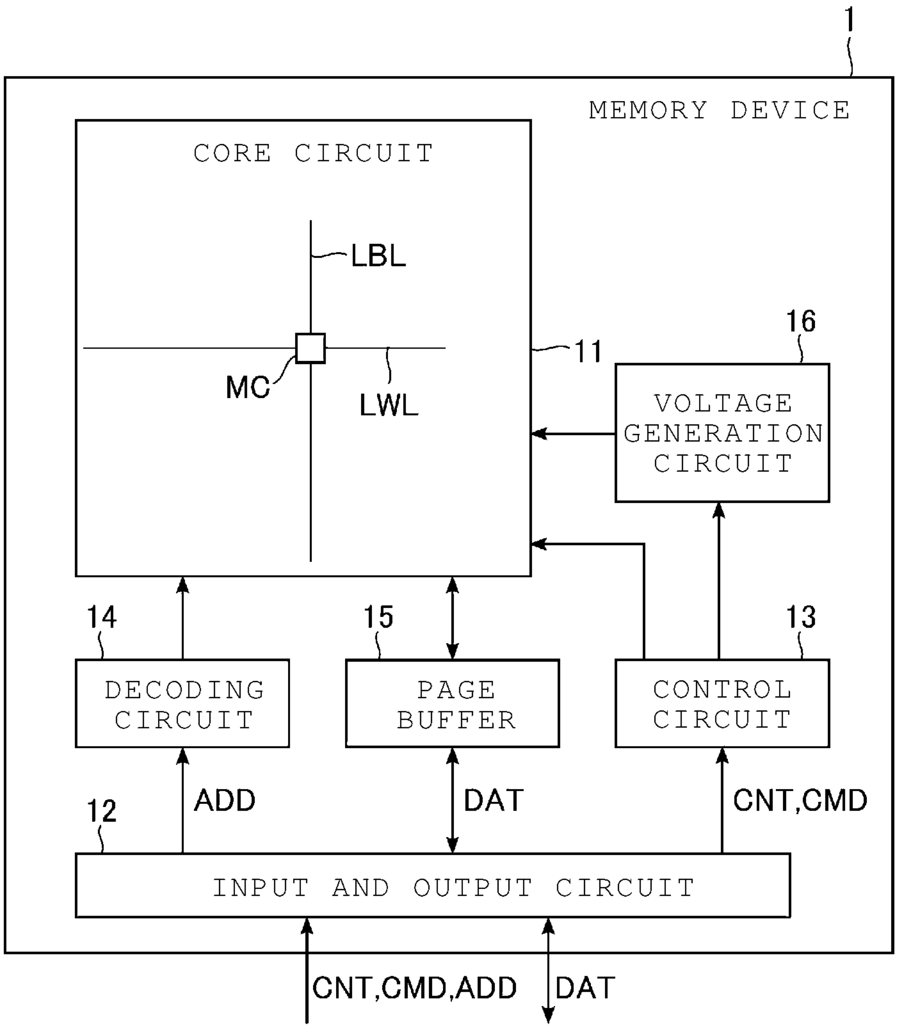
FIG. 1 is a block diagram of a memory device of a first embodiment.

Embodiments provide a memory device with high data reading performance.

In general, according to one embodiment, the memory device includes a first conductor, a first stacked body on the first conductor, a second conductor on the first stacked body, a second stacked body on the second conductor, and a third conductor on the second stacked body.

The first stacked body includes a first ferromagnetic layer, a first insulating layer, a second ferromagnetic layer, a non-magnetic first metal layer, and a third ferromagnetic layer stacked in order from a side of the first conductor. The second ferromagnetic layer and the third ferromagnetic layer have magnetizations in opposite directions. The second stacked body includes a fourth ferromagnetic layer, a second insulating layer, a fifth ferromagnetic layer, a non-magnetic second metal layer, and a sixth ferromagnetic layer stacked in order from a side of the second conductor. The fifth ferromagnetic layer and the sixth ferromagnetic layer have magnetizations in opposite directions. The sixth ferromagnetic layer has a volume larger than the volume of the third ferromagnetic layer.

A plurality of components having substantially the same function and configuration in one embodiment or different embodiments may have additional numbers or letters added to the end of the reference numerals to distinguish them from each other. In the embodiment following any described embodiment, the differences from the described embodiment are mainly described. All descriptions of one embodiment also apply as descriptions of another embodiment, unless explicitly excluded or where the exclusion is obvious.

It is not essential that each functional block is implemented as shown in the example below. For example, some functions may be executed by a functional block different from the example functional block. Further, the example functional block may be subdivided into finer functional sub-blocks.

As used in the present specification and the claims, when one first element is "connected" to another second element, the first element may be connected to the second element directly, or via an element that constantly or selectively becomes conductive.

1. First Embodiment

1.1. Structure (Configuration)

1.1.1. Overall Configuration

FIG. 1 is a block diagram of the memory device of the first embodiment. The memory device 1 is a device for storing data. The memory device 1 stores data using a stacked body of magnetic materials exhibiting variable resistance. The memory device 1 includes a core circuit 11, an input and output circuit 12, a control circuit 13, a decoding circuit 14, a page buffer 15, and a voltage generation circuit 16.

The core circuit 11 is a circuit including memory cells MC (only one of which is depicted in FIG. 1), wiring for accessing the memory cells MC, and peripheral circuits. The memory cell MC is an element that stores data in a non-volatile manner. The wiring includes global word lines GWL (not shown), local word lines LWL, global bit lines GBL (not shown), and local bit lines LBL. Each memory cell MC is connected to one local word line LWL and one local bit line LBL. The local word line LWL is assigned one row address. The local bit line LBL is assigned one column address.

The input and output circuit 12 is a circuit that inputs and outputs data and signals. The input and output circuit 12 receives the control signal CNT, the command CMD, the address signal ADD, and the data DAT to be written in the memory cell MC from the outside of the memory device 1, for example, a memory controller.

The control circuit 13 is a circuit that controls the operation of the memory device 1. The control circuit 13 receives the command CMD and the control signal CNT from the input and output circuit 12. The control circuit 13 controls the core circuit 11 based on the command CMD and the control signal CNT and controls the reading of data from the memory cell MC and the writing of data to the memory cell MC. The control circuit 13 controls the voltage generation circuit 16 based on the command CMD and the control signal CNT.

The decoding circuit 14 is a circuit that decodes the address signal ADD. The decoding circuit 14 receives the address signal ADD from the input and output circuit 12. The decoding circuit 14 decodes the address signal ADD and generates a signal to select a memory cell MC from or to which the data is read or written based on the result of the decoding. The generated signal is transmitted to the core circuit 11.

The page buffer 15 is a circuit that temporarily stores data of a certain size. The page buffer 15 receives the data DAT written in the memory cell MC from the input and output circuit 12, temporarily stores the data, and transfers the data to the core circuit 11. The page buffer 15 also receives the data read from the memory cell MC, temporarily stores the read data, and transfers the data DAT to the input and output circuit 12.

The voltage generation circuit 16 is a circuit that generates various voltages used in the memory device 1. The voltage generation circuit 16 generates a voltage based on the control of the control circuit 13. The voltage generation circuit 16 supplies the voltage used for data writing to the core circuit 11 during the writing of data to the memory cell MC. The voltage generation circuit 16 supplies the voltage used for data reading to the core circuit 11 during the reading of data from the memory cell MC.

1.1.2. Core Circuit Configuration

Figure 2:
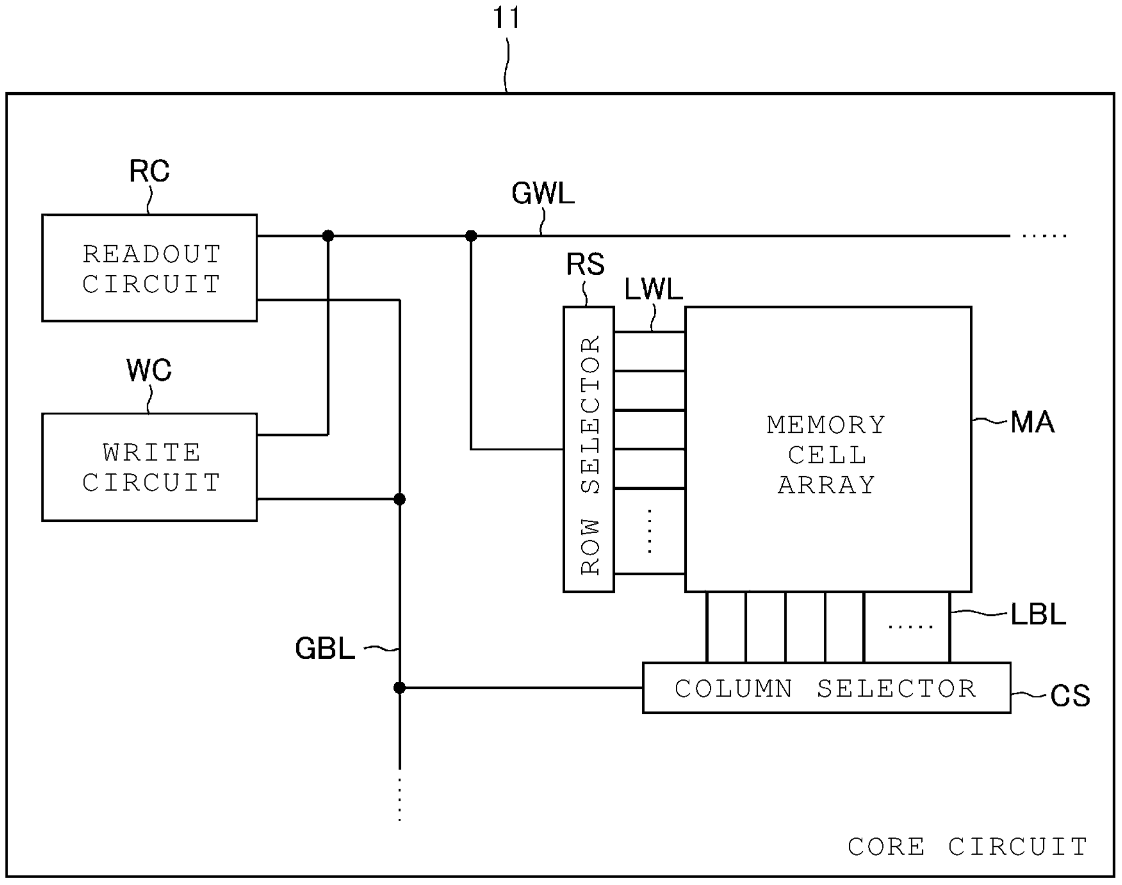
FIG. 2 is a block diagram of a core circuit of the first embodiment.

FIG. 2 is a block diagram of the core circuit 11 of the first embodiment. As shown in FIG. 2, the core circuit 11 includes a plurality of sets, each including a memory cell array MA, a row selector RS, a column selector CS. The core circuit 11 further includes a plurality of global word lines GWL, a plurality of local word lines LWL, a plurality of global bit lines GBL, a plurality of local bit lines LBL, a readout circuit RC, and a write circuit WC. FIG. 2 depicts only one set that includes a memory cell array MA, a row selector RS, and a column selector CS, along with one global word line GWL and one global bit line GBL.

The memory cell array MA is made up of a plurality of memory cells MC. A plurality of local word lines LWL and a plurality of local bit lines LBL are located in the memory cell array MA.

The row selector RS is provided for controlling one memory cell array MA. The row selector RS is a circuit for selecting one row of the corresponding memory cell array MA. The row selector RS receives a row address and connects one of the local word lines LWL of the corresponding memory cell array MA to one global word line GWL based on the received row address. The row selector RS includes a plurality of switches. Each switch is connected to one global word line GWL at one end and to one local word line LWL at the other end. The switch is, for example, a MOSFET (Metal Oxide Semiconductor Field Effect Transistor), for example, an n-type MOSFET.

The column selector CS is provided for controlling one memory cell array MA. The column selector CS is a circuit for selecting one column of the corresponding memory cell array MA. The column selector CS receives a column address and connects one of the local bit lines LBL of the corresponding memory cell array MA to one global bit line GBL based on the received column address. The column selector CS includes a plurality of switches. Each switch is connected to one global bit line GBL at one end and to one local bit line LBL at the other end. The switch is, for example, a MOSFET, for example, an n-type MOSFET.

The global word line GWL is connected to a plurality of row selectors RS. The global word line GWL is also connected to the readout circuit RC and the write circuit WC.

The global bit line GBL is connected to a plurality of column selectors CS. The global bit line GBL is also connected to the readout circuit RC and the write circuit WC.

The readout circuit RC is a circuit that controls the reading of data from the memory cell MC. The readout circuit RC uses a voltage that is based on the data stored in the data read target memory cell MC to determine the data stored in the data read target memory cell MC. The readout circuit RC includes a plurality of sense amplifier circuits SAC. The sense amplifier circuit SAC is a circuit that outputs data determined to be stored in the data read target memory cell MC by using a voltage that is based on the data stored in the data read target memory cell MC. The sense amplifier circuit SAC can output data based on the relationship between the voltage that is based on the data stored in the data read target memory cell MC (e.g., low hold voltage VhdL or a high hold voltage VhdH described below) and a reference voltage having a magnitude between the low hold voltage VhdL and the high hold voltage VhdH. The sense amplifier circuit SAC outputs the data determined to be stored in the data read target memory cell MC based on the relationship between the two voltages.

The write circuit WC is a circuit that controls the writing of data to the memory cell MC. The write circuit WC receives the data to be written. The write circuit WC writes data to the data write target memory cell MC by flowing a current through the data write target memory cell MC based on the data to be written.

1.1.3. Circuit Configuration of Memory Cell Array

Figure 3:
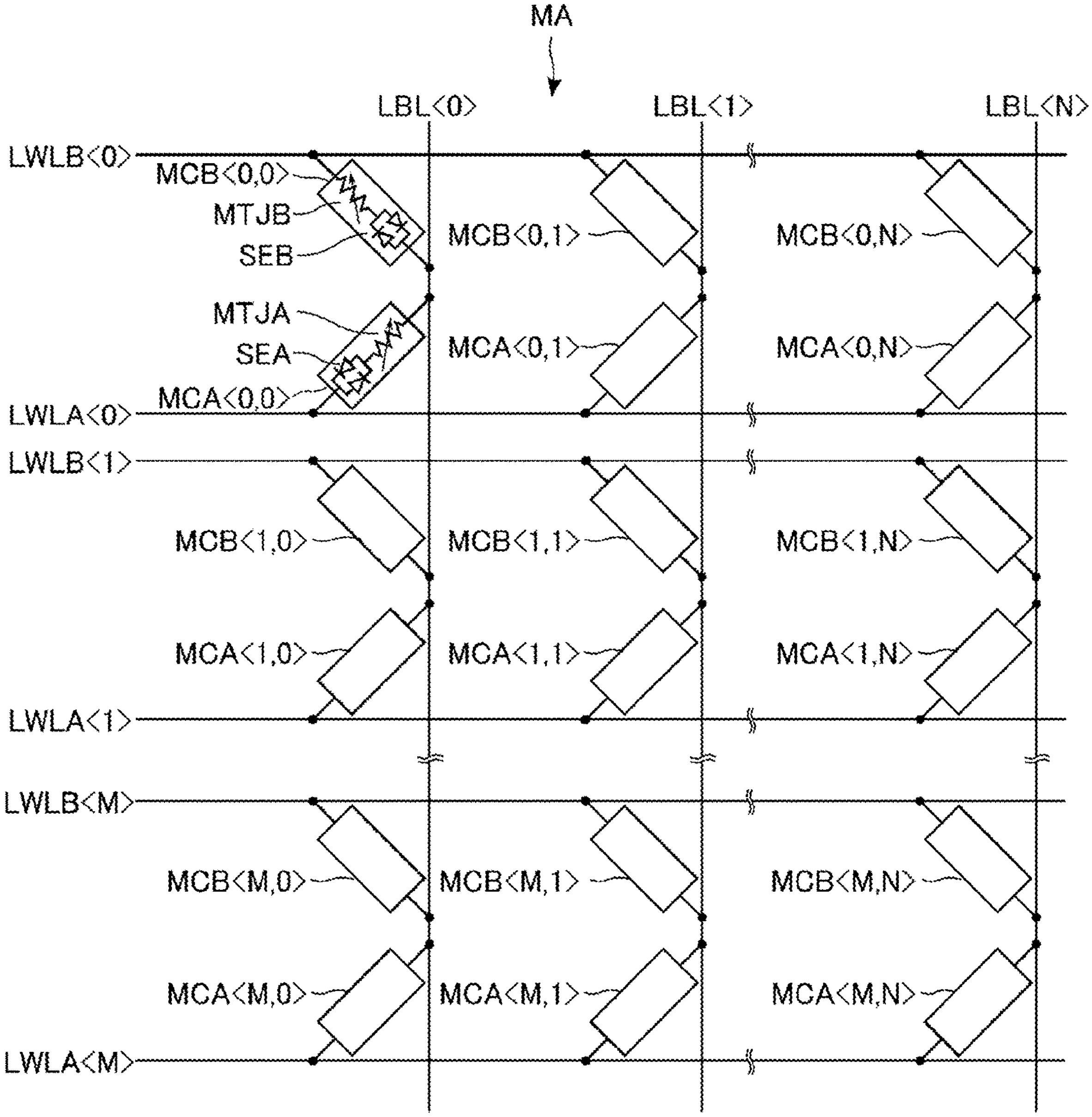
FIG. 3 is a circuit diagram of a memory cell array of the first embodiment.

FIG. 3 is a circuit diagram of the memory cell array MA of the first embodiment. As shown in FIG. 3, M+1 (M is a natural number) local word lines LWLA (LWLA <0>, LWLA <1>, . . . , LWLA <M>) and M+1 local word lines LWLB (LWLB <0>, LWLB <1>, . . . , LWLB <M>) are located in the memory cell array MA. N+1 (N is a natural number) local bit lines LBL (LBL <0>, LBL <1>, . . . , LBL <N>) are also located in the memory cell array MA.

Each memory cell MC (MCA and MCB) is connected to one local word line LWL and one local bit line LBL. More specifically, the memory cell MCA includes the memory cell MCA <α, β> for all combinations of all cases where α is an integer of 0 or more and M or less and all cases where β is an integer of 0 or more and N or less. The memory cell MCA <α, β> is connected between the local word line LWLA <α> and the local bit line LBL <β>. Similarly, the memory cell MCB includes the memory cell MCB <α, β> for all combinations of all cases where α is an integer of 0 or more and M or less and all cases where β is an integer of 0 or more and N or less. The memory cell MCB <α, β> is connected between the local word line LWLB <α> and the local bit line LBL <β>.

Each memory cell MC includes one magnetic tunnel junction (MTJ) element MTJ (MTJA or MTJB) and one switching element SE (SEA or SEB).

In each memory cell MC, the MTJ element MTJ and the switching element SE are connected in series. The switching element SEA of each memory cell MCA is connected to one local word line LWL. The MTJ element MTJA of each memory cell MCA is connected to one local bit line LBL. The switching element SEB of each memory cell MCB is connected to one local bit line LBL. The MTJ element MTJB of each memory cell MCB is connected to one local word line LWL.

The MTJ element MTJ is an element that exhibits a tunneling magnetoresistance effect and includes, for example, a magnetic tunnel junction (MTJ). The MTJ element MTJ can switch between a low resistance state and a high resistance state. The MTJ element MTJ can store 1-bit data by utilizing the difference between the two resistance states. For example, the MTJ element MTJ stores "0" data in a low resistance state and stores "1" data in a high resistance state.

The switching element SE is an element for selecting a memory cell MC in which this switching element SE is to be included. The switching element SE includes two terminals. When the voltage applied between the two terminals is less than a certain first threshold voltage, the switching element SE is in a high resistance state, for example, an electrically non-conducting state (OFF state). When the voltage applied between the two terminals rises and becomes equal to or higher than the first threshold voltage, the switching element SE goes into a low resistance state, for example, an electrically conducting state (ON state). When the voltage applied between the two terminals of the switching element SE in the low resistance state decreases and becomes equal to or lower than a second threshold voltage, the switching element SE goes into a high resistance state. The switching element SE has the same function as the switching function between the high resistance state and the low resistance state based on the magnitude of the voltage applied in the first direction, in a second direction opposite to a first direction. That is, the switching element SE is a bidirectional switching element. By turning on or off the switching element SE, it is possible to control whether a current is supplied to the MTJ element MTJ connected to the switching element SE, that is, the selection or non-selection of the MTJ element MTJ.

1.1.4. Structure of Memory Cell Array

Figure 4:
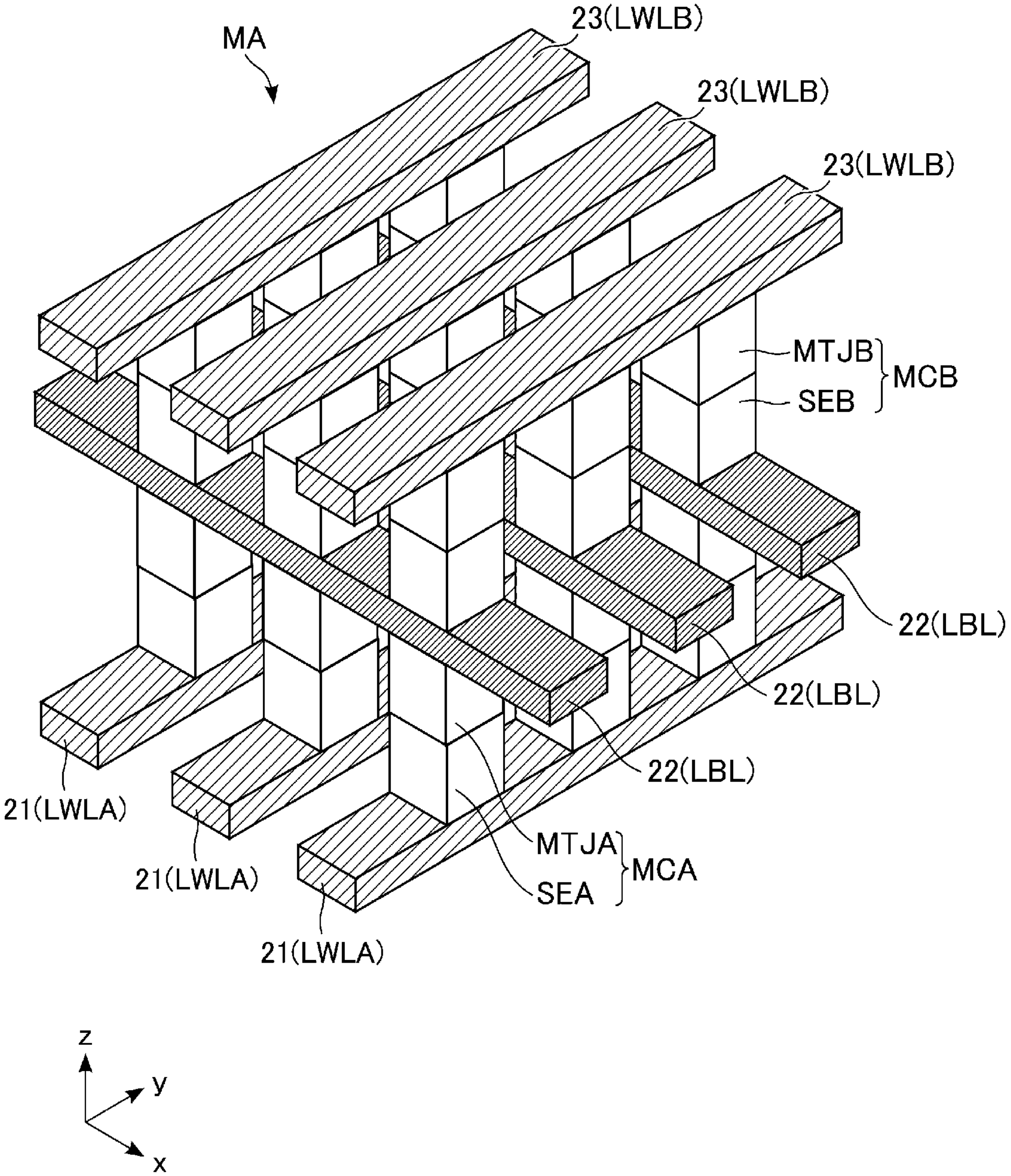
FIG. 4 is a perspective view of a part of the memory cell array of the first embodiment.

FIG. 4 is a perspective view of a part of the memory cell array MA of the first embodiment. The component hatches shown in FIG. 4 are attached solely for the purpose of visual comprehension of the drawing. The material of the hatched component is independent of the material indicated by the hatched pattern.

As shown in FIG. 4, the memory cell array MA includes memory cells MCA and MCB. A plurality of conductors 21, a plurality of conductors 22, and a plurality of conductors 23 are located in the memory cell array MA.

The conductors 21 extend along the y-axis and are arranged along the x-axis. Each conductor 21 functions as one local word line LWLA.

The conductors 22 are located above the conductors 21. The conductors 22 extend along the x-axis and are arranged along the y-axis. Each conductor 22 functions as one local bit line LBL.

The conductors 23 are located above the conductors 22. The conductors 23 extend along the y-axis and are arranged along the x-axis. Each conductor 23 functions as one local word line LWLB.

One memory cell MCA is provided at each intersection of the conductor 21 and the conductor 22. The memory cells MCA are located in a matrix configuration in the xy plane. Each memory cell MCA includes a structure that functions as a switching element SEA and a structure that functions as an MTJ element MTJA. The structure that functions as the switching element SEA and the structure that functions as the MTJ element MTJA each include one or a plurality of layers. The structure that functions as the MTJ element MTJA is located on the upper surface of the structure that functions as the switching element SEA. The lower surface of the memory cell MCA is in contact with the upper surface of one conductor 21. The upper surface of the memory cell MCA is in contact with the lower surface of one conductor 22. The memory cell MCA may be referred to as the lower memory cell MCA.

One memory cell MCB is provided at each intersection of the conductor 22 and the conductor 23. The memory cells MCB are located in a matrix configuration in the xy plane. Each memory cell MCB includes a structure that functions as a switching element SEB and a structure that functions as an MTJ element MTJB. The structure that functions as the switching element SEB and the structure that functions as the MTJ element MTJB each include one or a plurality of layers. The structure that functions as the MTJ element MTJB is located on the upper surface of the structure that functions as the switching element SEB. The lower surface of the memory cell MCB is in contact with the upper surface of one conductor 22. The upper surface of the memory cell MC is in contact with the lower surface of one conductor 23. The memory cell MCB may be referred to as the upper memory cell MCB.

1.1.5. Memory Cell Structure

Figure 5:
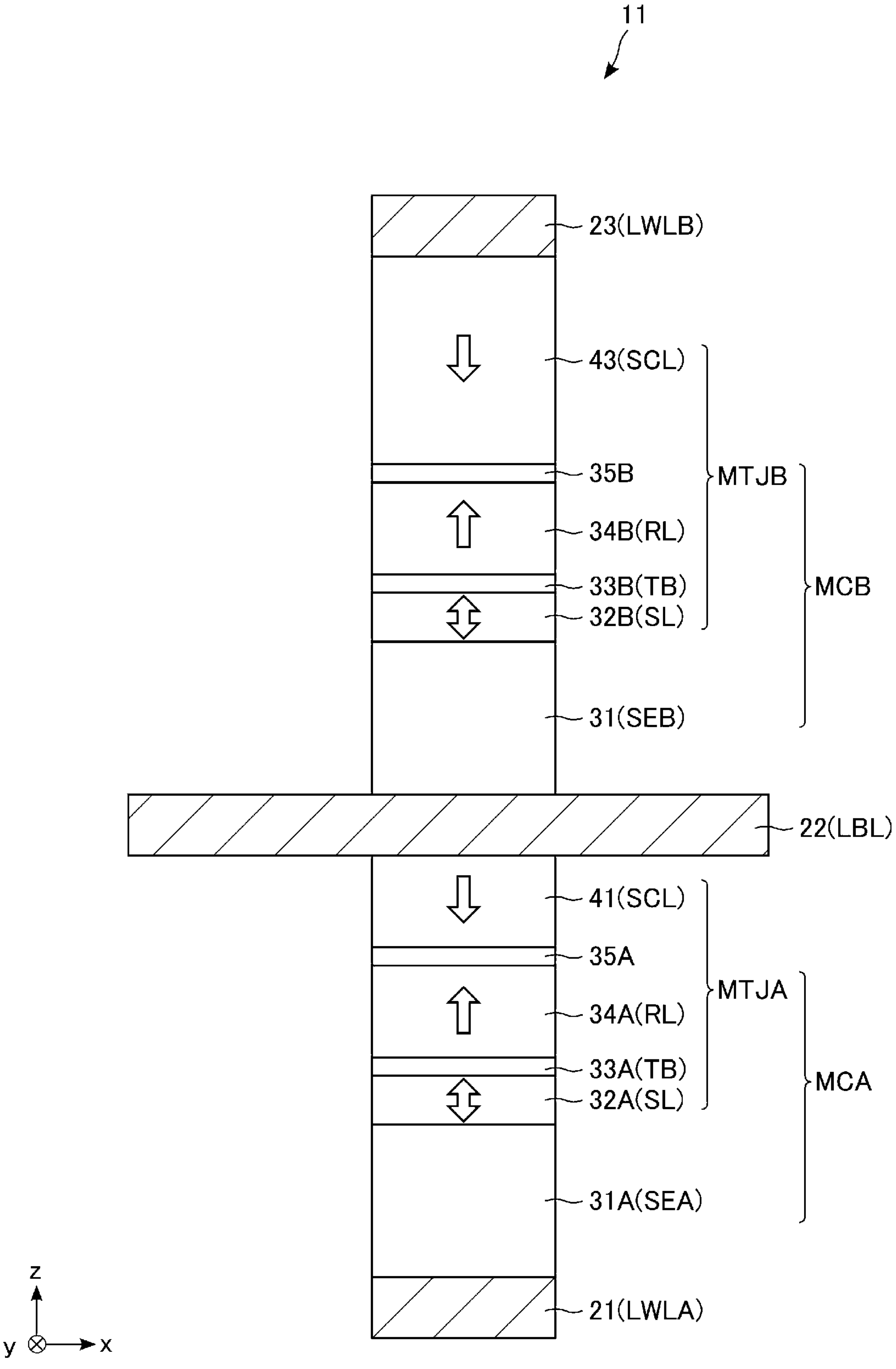
FIG. 5 is a diagram showing a cross section of an example of the structure of a memory cell of the first embodiment.

FIG. 5 shows a cross section of an example of the structure of the memory cell MC of the first embodiment. FIG. 5 shows the lower memory cell MCA and the upper memory cell MCB, and also shows the conductors 21, 22, and 23 connected to the lower memory cell MCA and the upper memory cell MCB. The lower memory cell MCA and the upper memory cell MCB each include several substantially identical components. Among the components common to the lower memory cell MCA and the upper memory cell MCB, the components provided in the lower memory cell MCA may have "A" added to the end of the reference numeral and the components provided in the upper memory cell MCB may have "B" added to the end of the reference numeral.

As shown in FIG. 5, the structure that functions as the lower memory cell MCA includes a structure that functions as a switching element SE, that is, a structure that functions as a switching element SEA. The structure that functions as the switching element SEA includes a variable resistance material 31, that is, a variable resistance material 31A.

The variable resistance material 31 is a material that exhibits variable resistance. The variable resistance material 31 is a switching element between two terminals, a first terminal of the two terminals is one of the upper surface and the lower surface of the variable resistance material 31, and a second terminal of the two terminals is the other of the upper surface and the lower surface of the variable resistance material 31. When the voltage applied between the two terminals is less than a certain first threshold voltage, the variable resistance material 31 is in a "high resistance" state, for example, an electrically non-conducting state. When the voltage applied between the two terminals rises and becomes equal to or higher than the first threshold voltage, the variable resistance material 31 is in a "low resistance" state, for example, an electrically conducting state. When the voltage applied between the two terminals of the variable resistance material 31 in the low resistance state decreases and becomes equal to or lower than a second threshold voltage, the variable resistance material 31 goes into the high resistance state. The variable resistance material 31 includes an insulator and a dopant introduced into the insulator by ion implantation. The insulator includes, for example, oxides and contains $SiO_2$ or materials substantially composed of $SiO_2$. The dopant includes, for example, arsenic (As) and germanium (Ge). As used in the specification and the claims, the phrase "substantially formed of (composed of)" including the term "substantially" and similar phrases are meant to allow a "substantially" formed element to contain unintended impurities.

The structure that functions as the switching element SE may further include a lower electrode and an upper electrode. In this case, the variable resistance material 31 is located on the upper surface of the lower electrode and the upper electrode is located on the upper surface of the variable resistance material 31.

The structures that function as the lower memory cell MCA each include a ferromagnetic layer 32, an insulating layer 33, a ferromagnetic layer 34, and a metal layer 35, that is, a ferromagnetic layer 32A, an insulating layer 33A, a ferromagnetic layer 34A, and a metal layer 35A. The structure that functions as the MTJ element MTJA further includes a ferromagnetic layer 41. The ferromagnetic layer 32, the insulating layer 33, the ferromagnetic layer 34, the metal layer 35, and the ferromagnetic layer 41 are stacked on the upper surface of the variable resistance material 31A in this order.

The ferromagnetic layer 32 is a layer of a material exhibiting ferromagnetism. The ferromagnetic layer 32 contains, for example, cobalt iron boron (CoFeB) or iron boride (FeB), or is substantially composed of CoFeB or FeB. The ferromagnetic layer 32 has an axis of easy magnetization along the direction penetrating the interface of the ferromagnetic layer 32, the insulating layer 33, and the ferromagnetic layer 34, for example, an axis of easy magnetization at an angle of 45° or more and 90° or less with respect to the interface. For example, the ferromagnetic layer 32 has an axis of easy magnetization along a direction orthogonal to the interface. The magnetization direction of the ferromagnetic layer 32 is variable by writing data to the memory cell MC and the ferromagnetic layer 32 can function as a so-called storage layer (SL). Hereinafter, the ferromagnetic layer 32 may be referred to as a storage layer 32. The storage layer 32 may include a plurality of layers.

The insulating layer 33 is a layer of an insulator. The insulating layer 33 contains, for example, magnesium oxide (MgO) or is substantially composed of MgO. The insulating layer 33 functions as a so-called tunnel barrier (TB).

The ferromagnetic layer 34 is a layer of a material exhibiting ferromagnetism. The ferromagnetic layer 34 has an axis of easy magnetization along the direction penetrating the interface of the ferromagnetic layer 32, the insulating layer 33, and the ferromagnetic layer 34, for example, an axis of easy magnetization at an angle of 45° or more and 90° or less with respect to the interface. For example, the ferromagnetic layer 34 has an axis of easy magnetization along a direction orthogonal to the interface. It is intended that the magnetization direction of the ferromagnetic layer 34 is invariant during reading and writing data in the memory cell MC. The ferromagnetic layer 34 can function as a so-called reference layer (RL). Hereinafter, the ferromagnetic layer 34 may be referred to as a reference layer 34. The ferromagnetic layer 34 may include a plurality of layers.

When the magnetization direction of the storage layer 32 is parallel to the magnetization direction of the reference layer 34, the MTJ element MTJ has a certain low resistance. When the magnetization direction of the storage layer 32 is antiparallel to the magnetization direction of the reference layer 34, the MTJ element MTJ has a resistance higher than the resistance when the magnetization direction of the storage layer 32 and the magnetization direction of the reference layer 34 are parallel. Hereinafter, the state in which the magnetization direction of the storage layer 32 is parallel to the magnetization direction of the reference layer 34 may be referred to as a "parallel state" or a "P state". The state in which the magnetization direction of the storage layer 32 is antiparallel to the magnetization direction of the reference layer 34 may be referred to as the "anti-parallel state" or "AP state".

When a switching current Icp having a certain magnitude flows from the storage layer 32 toward the reference layer 34, the magnetization direction of the storage layer 32 becomes parallel to the magnetization direction of the reference layer 34. When another switching current Icap of certain magnitude flows from the reference layer 34 toward the storage layer 32, the magnetization direction of the storage layer 32 becomes anti-parallel to the magnetization direction of the reference layer 34. The magnitude of the switching current Icap is different from the magnitude of the switching current Icp.

The metal layer 35 is a non-magnetic metal layer that anti-ferromagnetically couples two ferromagnetic materials sandwiching the metal layer 35. The metal layer 35 contains ruthenium (Ru) or iridium (Ir) or is substantially composed of Ru or Ir. Ru and Ir allow two ferromagnetic materials sandwiching a layer of Ru or Ir to be coupled either ferromagnetically or anti-ferromagnetically based on the thickness of Ru or Ir. The metal layer 35 has a thickness that allows the ferromagnetic layer 32 and the ferromagnetic layer 41 to be anti-ferromagnetically coupled. Therefore, the ferromagnetic layer 32 and the ferromagnetic layer 41 are anti-ferromagnetically coupled.

The ferromagnetic layer 41 is a layer of a ferromagnetic material. The ferromagnetic layer 41 contains an element exhibiting ferromagnetism or is substantially composed of an element exhibiting ferromagnetism. The ferromagnetic layer 41 contains cobalt platinum (CoPt), cobalt nickel (CoNi), or cobalt palladium (CoPd) or is substantially composed of CoPt, CoNi, or CoPd. The ferromagnetic layer 41 includes, for example, a structure in which a cobalt (Co) layer and a platinum (Pt) layer are alternately repeated by one or more, a structure in which a cobalt layer and a nickel (Ni) layer are alternately repeated by one or more, or a structure in which a cobalt layer and a palladium (Pd) layer are alternately repeated by one or more.

The ferromagnetic layer 41 has magnetization in the direction opposite to the magnetization direction of the reference layer 34A. The ferromagnetic layer 41 reduces the magnetic field generated by the reference layer 34A and applied to the storage layer 32A, that is, the leakage magnetic field. The ferromagnetic layer 41 functions as a so-called shift cancel layer (SCL). Hereinafter, the ferromagnetic layer 41 may be referred to as a shift cancel layer 41.

The structure that functions as the upper memory cell MCB includes a structure that functions as a switching element SE, that is, a structure that functions as a switching element SEB. The structure that functions as the switching element SEB includes a variable resistance material 31, that is, a variable resistance material 31B.

The structure that functions as the MTJ element MTJB includes a ferromagnetic layer 32, an insulating layer 33, a ferromagnetic layer 34, and a metal layer 35, that is, a ferromagnetic layer 32B, an insulating layer 33B, a ferromagnetic layer 34B, and a metal layer 35B. The structure that functions as the MTJ element MTJB further includes a ferromagnetic layer 43. The ferromagnetic layer 32B, the insulating layer 33B, the ferromagnetic layer 34B, the metal layer 35B, and the ferromagnetic layer 43 are stacked on the upper surface of the variable resistance material 31B in this order.

The ferromagnetic layer 43 is a layer of a ferromagnetic material. The ferromagnetic layer 43 contains an element exhibiting ferromagnetism or is substantially composed of an element exhibiting ferromagnetism. The ferromagnetic layer 43 contains cobalt platinum (CoPt), cobalt nickel (CoNi), or cobalt palladium (CoPd), or is substantially composed of CoPt, CoNi, or CoPd. The ferromagnetic layer 43 includes, for example, a structure in which a cobalt (Co) layer and a platinum (Pt) layer are alternately repeated by one or more, a structure in which a cobalt layer and a nickel (Ni) layer are alternately repeated by one or more, or a structure in which a cobalt layer and a palladium (Pd) layer are alternately repeated by one or more.

The ferromagnetic layer 43 has magnetization in the direction opposite to the magnetization direction of the reference layer 34B. The ferromagnetic layer 43 reduces a magnetic field generated by the ferromagnetic layer 34B and applied to the ferromagnetic layer 32B, that is, a leakage magnetic field. The ferromagnetic layer 43 functions as a so-called shift cancel layer. Hereinafter, the ferromagnetic layer 43 may be referred to as a shift cancel layer 43.

The ferromagnetic layer 43 has the same coercive force per unit volume as the coercive force per unit volume of the ferromagnetic layer 41. Therefore, the ferromagnetic layer 43 can be made of substantially the same material as the material of the ferromagnetic layer 41. On the other hand, the ferromagnetic layer 43 has a volume larger than the volume of the ferromagnetic layer 41. That is, the ferromagnetic layer 41 has a volume VL1 and the ferromagnetic layer 43 has a volume VL2, and VL1<VL2.

Since the ferromagnetic layer 43 has a volume larger than the volume of the ferromagnetic layer 41, the ferromagnetic layer 41 and the ferromagnetic layer 43 can have the dimensions described below. That is, the ferromagnetic layer 41 and the ferromagnetic layer 43 have the same shape along the xy plane and have different heights (dimensions along the z-axis). FIG. 5 shows such an example. As an example, the lower memory cell MCA and the upper memory cell MCB have a substantially circular shape along the xy plane, and the ferromagnetic layer 41 and the ferromagnetic layer 43 have also a substantially circular shape along the xy plane. The radius of the ferromagnetic layer 41 along the xy plane is substantially the same as the radius of the ferromagnetic layer 43 along the xy plane. On the other hand, the height of the ferromagnetic layer 43 is higher than the height of the ferromagnetic layer 41. A more specific example will be described with reference to FIG. 6.

Figure 6:
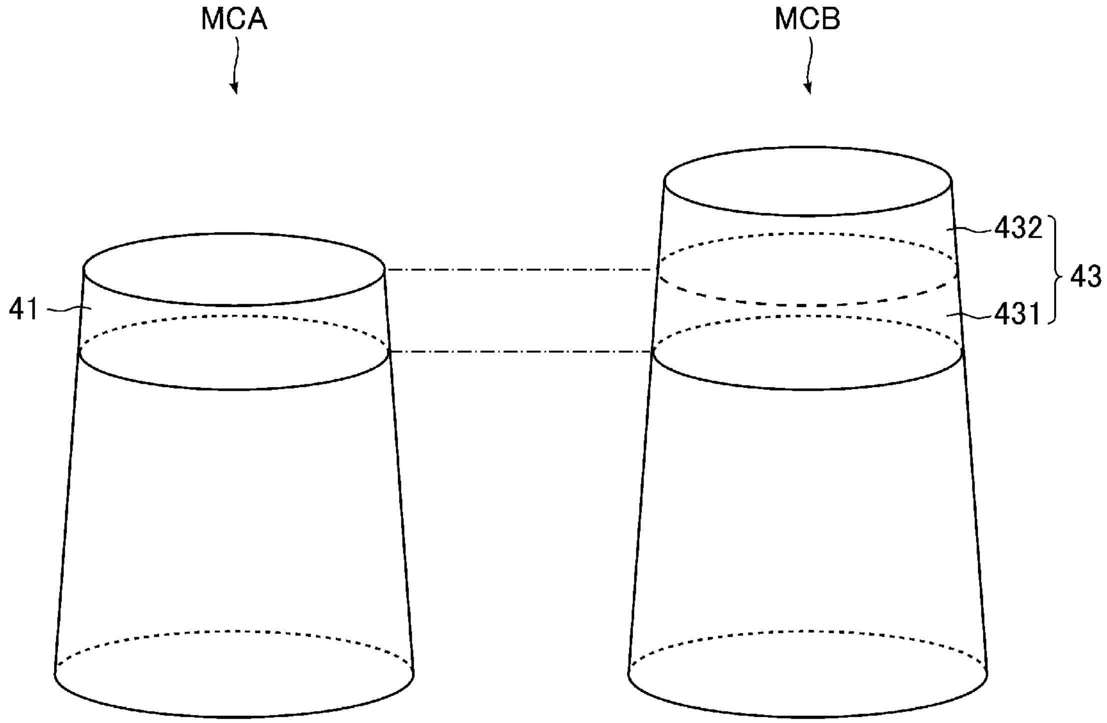
FIG. 6 is a diagram showing the shapes of some memory cells of the memory device of the first embodiment.

FIG. 6 shows the shapes of several memory cells of the memory device of the first embodiment and shows the shapes of the lower memory cell MCA and the upper memory cell MCB. As shown in FIG. 6, at least a portion of the lower memory cell MCA and at least a portion of the upper memory cell MCB are tilted along the z-axis on the sides. For example, the lower memory cell MCA and the upper memory cell MCB have a substantially truncated cone shape, and the ferromagnetic layer 41 and the ferromagnetic layer 43 also have a substantially truncated cone shape. The ferromagnetic layer 43 is composed of a first portion 431 and a second portion 432. The first portion 431 is the lower part of the ferromagnetic layer 43, and the second portion 432 is the upper part of the ferromagnetic layer 43. The first portion 431 has substantially the same shape as the ferromagnetic layer 41. Therefore, the ferromagnetic layer 43 has a volume larger than the volume of the ferromagnetic layer 41 by the amount of the second portion 432.

Since the ferromagnetic layer 43 has a volume larger than the volume of the ferromagnetic layer 41, the ferromagnetic layer 43 has a higher coercive force than the coercive force of the ferromagnetic layer 41. Since the ferromagnetic layer 43 has a higher coercive force than the coercive force of the ferromagnetic layer 41, the magnitudes of the switching currents Icp and Icap of the lower memory cell MCA are different from the magnitudes of the switching currents Icp and Icap of the upper memory cell MCB.

Figure 7A:
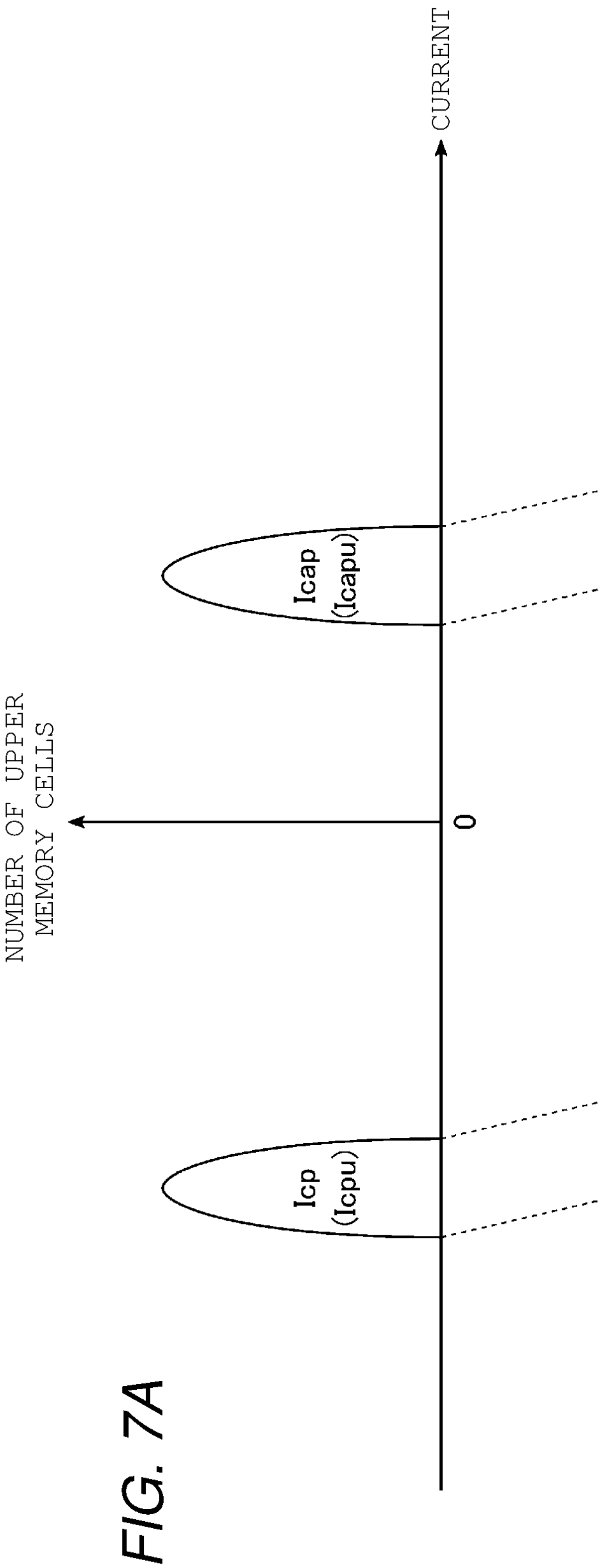
FIGS. 7A and 7B are diagrams showing a distribution of switching currents in the memory device of the first embodiment.
Figure 7B:
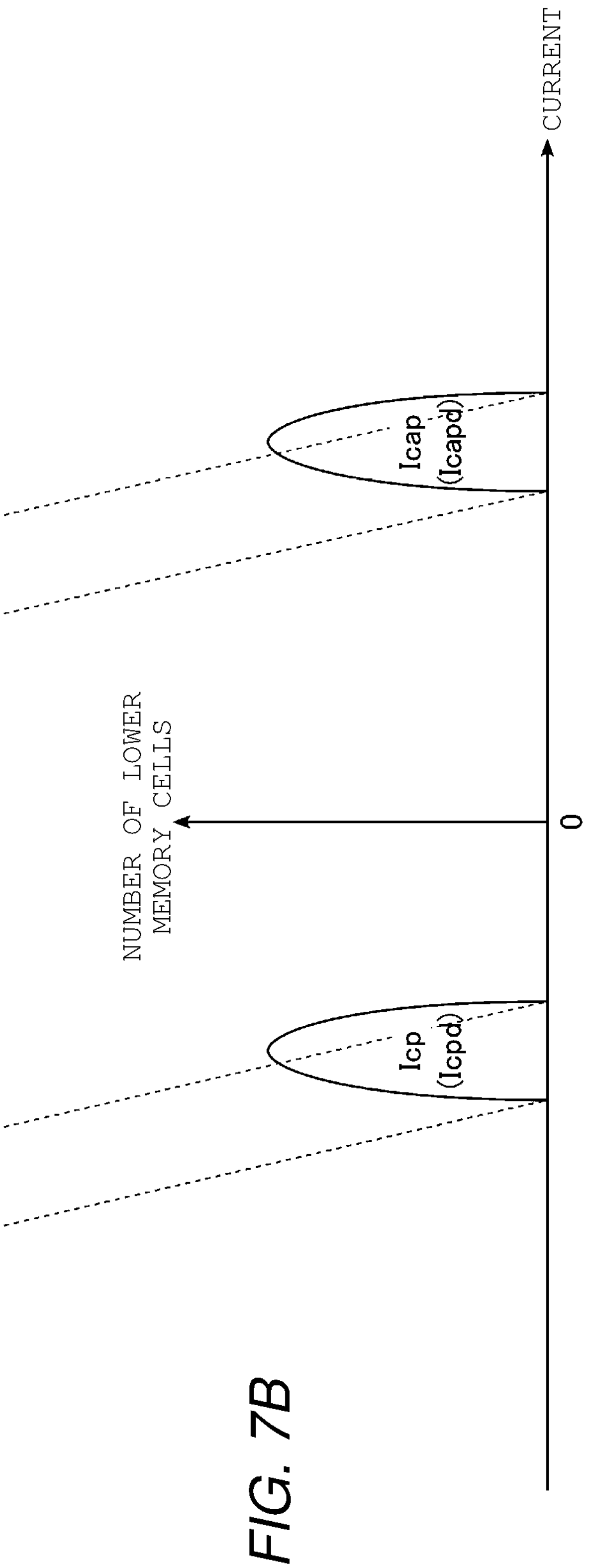

FIGS. 7A and 7B show the distribution of the switching current of the first embodiment. More specifically, FIGS. 7A and 7B show the relationship between the switching current and the number of memory cells MC.

FIGS. 7A and 7B show the upper memory cell MCB and the lower memory cell MCA, respectively. The horizontal axis in FIGS. 7A and 7B show the magnitude of the current. The positive current is the current in the direction from the reference layer 34 to the storage layer 32. Hereinafter, the direction from the reference layer 34 to the storage layer 32 may be referred to as an AP direction. The negative current is the current in the direction from the storage layer 32 to the reference layer 34. Hereinafter, the direction from the storage layer 32 to the reference layer 34 may be referred to as the P direction.

The switching current Icap flows in the AP direction and may be referred to as an AP-direction switching current Icap. The switching current Icp flows in the P direction and may be referred to as a P-direction switching current Icp. The AP-direction switching current Icap depends on the characteristics of the memory cell MC and therefore has a different magnitude for each memory cell MC. Similarly, the P-direction switching current Icp depends on the characteristics of the memory cell MC and therefore has a different magnitude for each memory cell MC.

If the memory cell MC does not include the shift cancel layer 41 nor the shift cancel layer 43, the memory cell MC tends to be in the P state and is unlikely to be in the AP state. That is, the magnitude of the P-direction switching current Icp is small and the magnitude of the AP-direction switching current Icap is large. On the other hand, if the memory cell MC includes the shift cancel layer 41 or 43, the AP-direction switching current Icap is smaller than that without the shift cancel layer 41 or 43. Meanwhile, if the memory cell MC includes the shift cancel layer 41 or 43, the P-direction switching current Icp is larger than that without the shift cancel layer 41 or 43. That is, the shift cancel layers 41 and 43 reduce the AP-direction switching current Icap and increase the P-direction switching current Icp. This function is higher as the coercive force of the shift cancel layer 41 or 43 is higher.

As shown in FIG. 7B, the AP-direction switching current Icap of the lower memory cell MCA is distributed over a range of a certain magnitude. Similarly, the P-direction switching current Icp of the lower memory cell MCA is distributed over a range of a certain magnitude. Hereinafter, the P-direction switching current Icp of the lower memory cell MCA may be referred to as the lower P-direction switching current Icpd. The AP-direction switching current Icap of the lower memory cell MCA may be referred to as the lower AP-direction switching current Icapd.

As described with reference to FIG. 5, the shift cancel layer 43 of the upper memory cell MCB has a larger coercive force than the shift cancel layer 41 of the lower memory cell MCA. Therefore, as shown in FIGS. 7A, the magnitude of the P-direction switching current Icp of the upper memory cell MCB is larger than the magnitude of the P-direction switching current Icp of the lower memory cell MCA. Further, the magnitude of the AP-direction switching current Icap of the upper memory cell MCB is smaller than the magnitude of the AP-direction switching current Icap of the lower memory cell MCA.

Hereinafter, the P-direction switching current Icp of the upper memory cell MCB may be referred to as the upper P-direction switching current Icpu. The AP-direction switching current Icap of the upper memory cell MCB may be referred to as the upper AP-direction switching current Icapu.

Figure 8:
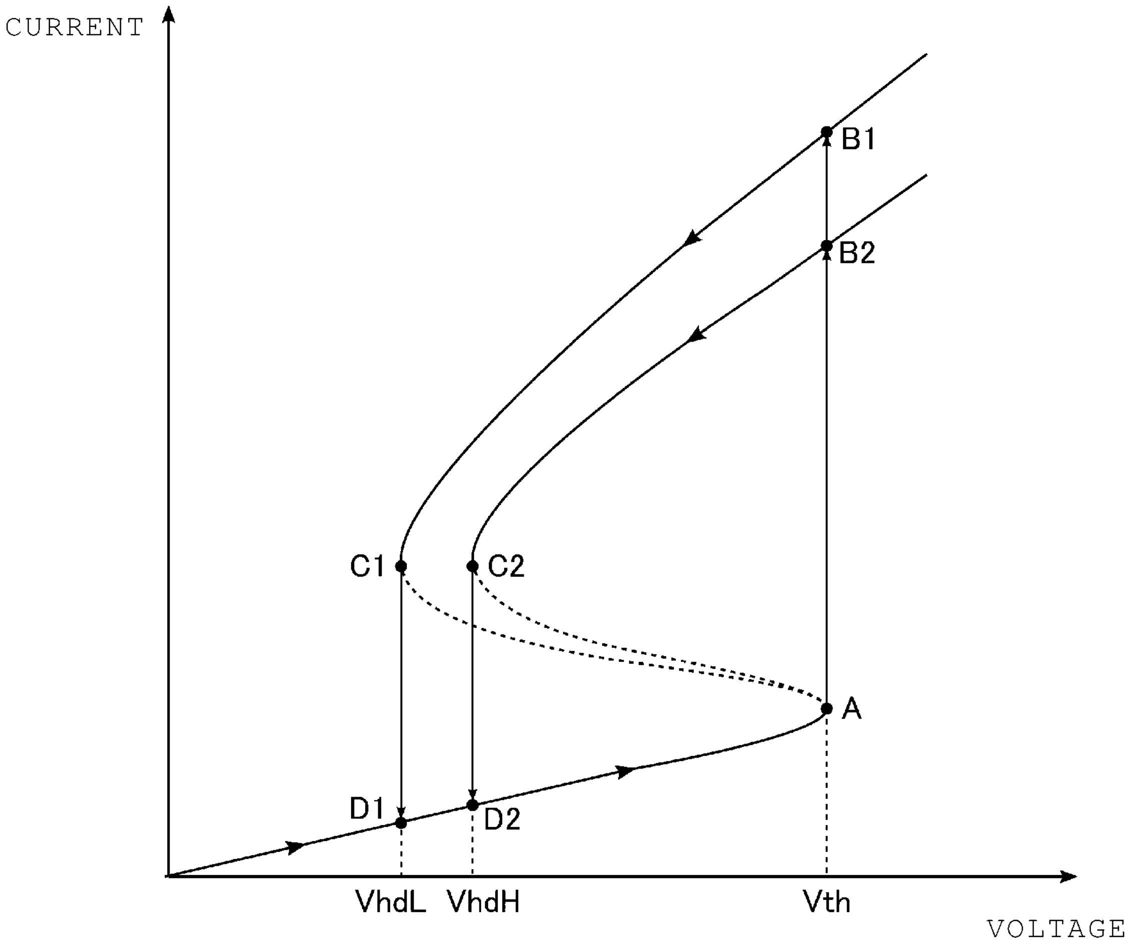
FIG. 8 is a graph showing an example of voltage and current characteristics of the memory cell of the first embodiment.

FIG. 8 is a graph showing an example of the voltage and current characteristics of the memory cell MC of the first embodiment. The horizontal axis of the graph shows the magnitude of the terminal voltage of the memory cell MC. The vertical axis of the graph shows the magnitude of the current flowing through the memory cell MC on a logarithmic scale. In FIG. 8, the virtual characteristics that do not actually appear are shown by broken lines. FIG. 8 shows the case where the memory cell MC is in the low resistance state and the case where the memory cell MC is in the high resistance state. The following description applies to both the low resistance state and the high resistance state of the memory cell MC.

When the voltage is increased from 0, the current continues to increase until the magnitude of the voltage reaches a threshold voltage Vth. Until the voltage reaches the threshold voltage Vth, the switching element SE of the memory cell MC is off, that is, non-conducting.

When the voltage is further increased and reaches the threshold voltage Vth, that is, when point A is reached, the relationship between voltage and current shows a discontinuous change and exhibits the characteristics shown at points B1 and B2. The magnitude of the current at points B1 and B2 is significantly larger than the magnitude of the current at point A. This sudden change in current is based on the fact that the switching element SE of the memory cell MC is turned on. The magnitude of the current at points B1 and B2 depends on the resistance state of the MTJ element MTJ of the memory cell MC.

When the voltage is reduced from the state in which the switching element SE is on, for example, the state in which the voltage and the current show the relationship shown at the point B1 or the point B2, the current continues to decrease.

When the voltage is further reduced and reaches a certain magnitude, the relationship between the voltage and the current shows a discontinuous change. The voltage at which the relationship between voltage and current begins to show discontinuity depends on the terminal voltage of the MTJ element MTJ of the memory cell MC, that is, whether the MTJ element MTJ is in a high resistance state or a low resistance state. When the MTJ element MTJ is in a low resistance state, the relationship between voltage and current shows discontinuity from the point C1. When the MTJ element MTJ is in a high resistance state, the relationship between voltage and current shows discontinuity from the point C2. The relationship between voltage and current will show the characteristics shown at the points D1 and D2, respectively, when the points C1 and C2 are reached. The magnitude of the current at the points D1 and D2 is significantly smaller than the magnitude of the current at the points C1 and C2, respectively. This sudden change in current is based on the fact that the switching element SE of the memory cell MC is turned off.

The terminal voltage at the point D1 of the memory cell MC including the MTJ element MTJ in a low resistance state may be referred to as the low hold voltage VhdL. The terminal voltage at point D2 of the memory cell MC including the MTJ element MTJ in the high resistance state may be referred to as the high hold voltage VhdH.

1.1.6. Readout Circuit Configuration

Figure 9:
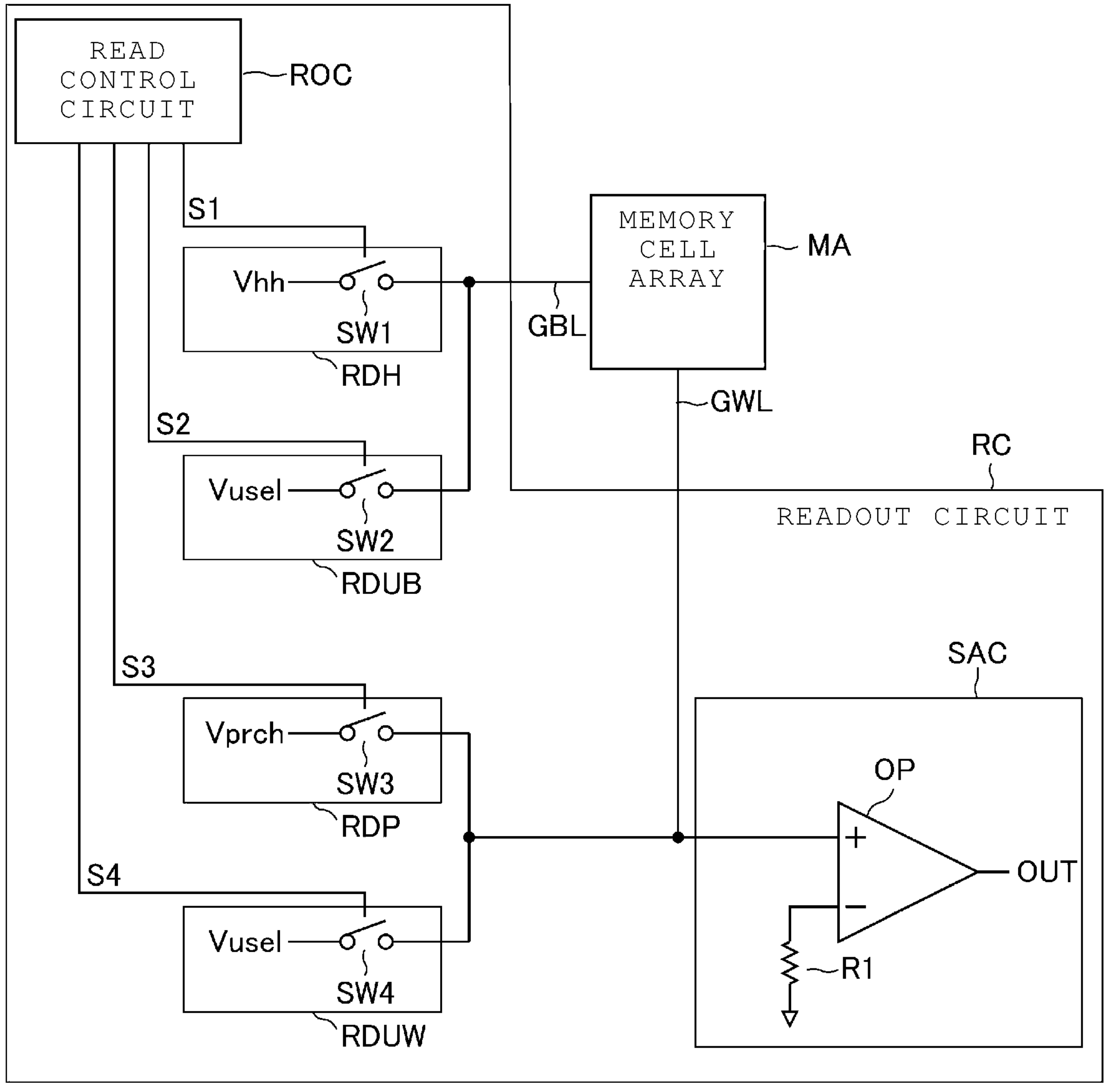
FIG. 9 is a diagram showing components of a readout circuit in the memory device of the first embodiment and connections between the components.

FIG. 9 shows the components of the readout circuit of the first embodiment and the connections between the components. As shown in FIG. 9, the readout circuit RC includes a read control circuit ROC, driver circuits RDH, RDUB, RDP, and RDUW, and a sense amplifier circuit SAC. FIG. 9 shows only the components for one global bit line GBL and one global word line GWL. The driver circuits RDH and RDUB are also provided for other global bit lines GBL. In addition, the driver circuits RDP and RDUW and the sense amplifier circuit SAC are also provided for other global word lines GWL.

The driver circuit RDH is configured so that the power supply voltage Vhh can be applied to the global bit line GBL. The power supply voltage Vhh is the internal power supply voltage of the memory device 1 and is higher than the ground voltage (or common voltage) Vss. The driver circuit RDH may have any configuration as long as the power supply voltage Vhh can be applied to the global bit line GBL. For example, the driver circuit RDH includes a switch circuit SW1. The switch circuit SW1 is connected to the global bit line GBL at one end and to the node to which the power supply voltage Vhh is applied in the memory device 1 at the other end. The switch circuit SW1 turns on or off based on the control signal S1 and transfers the power supply voltage Vhh to the global bit line GBL. The switch circuit SW1 receives, for example, the control signal S1 from the read control circuit ROC. The switch circuit SW1 is, for example, a MOSFET.

The driver circuit RDUB is configured so that the non-selection voltage Vusel can be applied to the global bit line GBL. The non-selection voltage Vusel is, for example, higher than the ground voltage Vss and lower than the power supply voltage Vhh. The ground voltage Vss is, for example, 0 V. The driver circuit RDUB may have any configuration as long as a non-selection voltage Vusel can be applied to the global bit line GBL. For example, the driver circuit RDUB includes a switch circuit SW2. The switch circuit SW2 is connected to the global bit line GBL at one end and to the node to which the non-selection voltage Vusel is applied in the memory device 1 at the other end. The switch circuit SW2 turns on or off based on the control signal S2 and transfers the non-selection voltage Vusel to the global bit line GBL. The switch circuit SW2 receives, for example, the control signal S2 from the read control circuit ROC. The switch circuit SW2 is, for example, a MOSFET.

The driver circuit RDP is configured so that a precharge voltage Vprch can be applied to the global bit line GBL. The precharge voltage Vprch is higher than the ground voltage Vss and lower than the non-selection voltage Vusel. The driver circuit RDP may have any configuration as long as the precharge voltage Vprch can be applied to the global word line GWL. For example, driver circuit RDP includes a switch circuit SW3. The switch circuit SW3 is connected to the global word line GWL at one end and to the node to which the precharge voltage Vprch is applied in the memory device 1 at the other end. The switch circuit SW3 turns on or off based on the control signal S3 and transfers the precharge voltage Vprch to the global word line GWL. The switch circuit SW3 receives the control signal S3 from, for example, the read control circuit ROC. The switch circuit SW3 is, for example, a MOSFET.

The driver circuit RDUW is configured so that the non-selection voltage Vusel can be applied to the global word line GWL. The driver circuit RDUW may have any configuration as long as a non-selection voltage Vusel can be applied to the global word line GWL. For example, the driver circuit RDUW includes a switch circuit SW4. The switch circuit SW4 is connected to the global word line GWL at one end and to the node to which the non-selection voltage Vusel is applied in the memory device 1 at the other end. The switch circuit SW4 turns on or off based on the control signal S4 and transfers the non-selection voltage Vusel to the global word line GWL. The switch circuit SW4 receives, for example, the control signal S4 from the read control circuit ROC. The switch circuit SW4 is, for example, a MOSFET.

The sense amplifier circuit SAC includes an operational amplifier OP and a resistor R1. The operational amplifier OP is connected to the global word line GWL at the non-inverting input terminal. The inverting input terminal of the operational amplifier OP is grounded via the resistor R1, that is, connected to a node having a ground voltage Vss. The resistor R1 has a magnitude such that a voltage having a magnitude between a low hold voltage VhdL and a high hold voltage VhdH is applied to the inverting input terminal of the operational amplifier OP. The output OUT of the operational amplifier OP is 1-bit data determined to be stored in the read target memory cell MC in the memory cell array MA to which the operational amplifier OP is connected.

The read control circuit ROC operates based on the control signal generated by the control circuit 13 and the decoding circuit 14 based on the control signal CNT, the command CMD, and the address signal ADD.

1.1.7. Write Circuit Configuration

Figure 10:
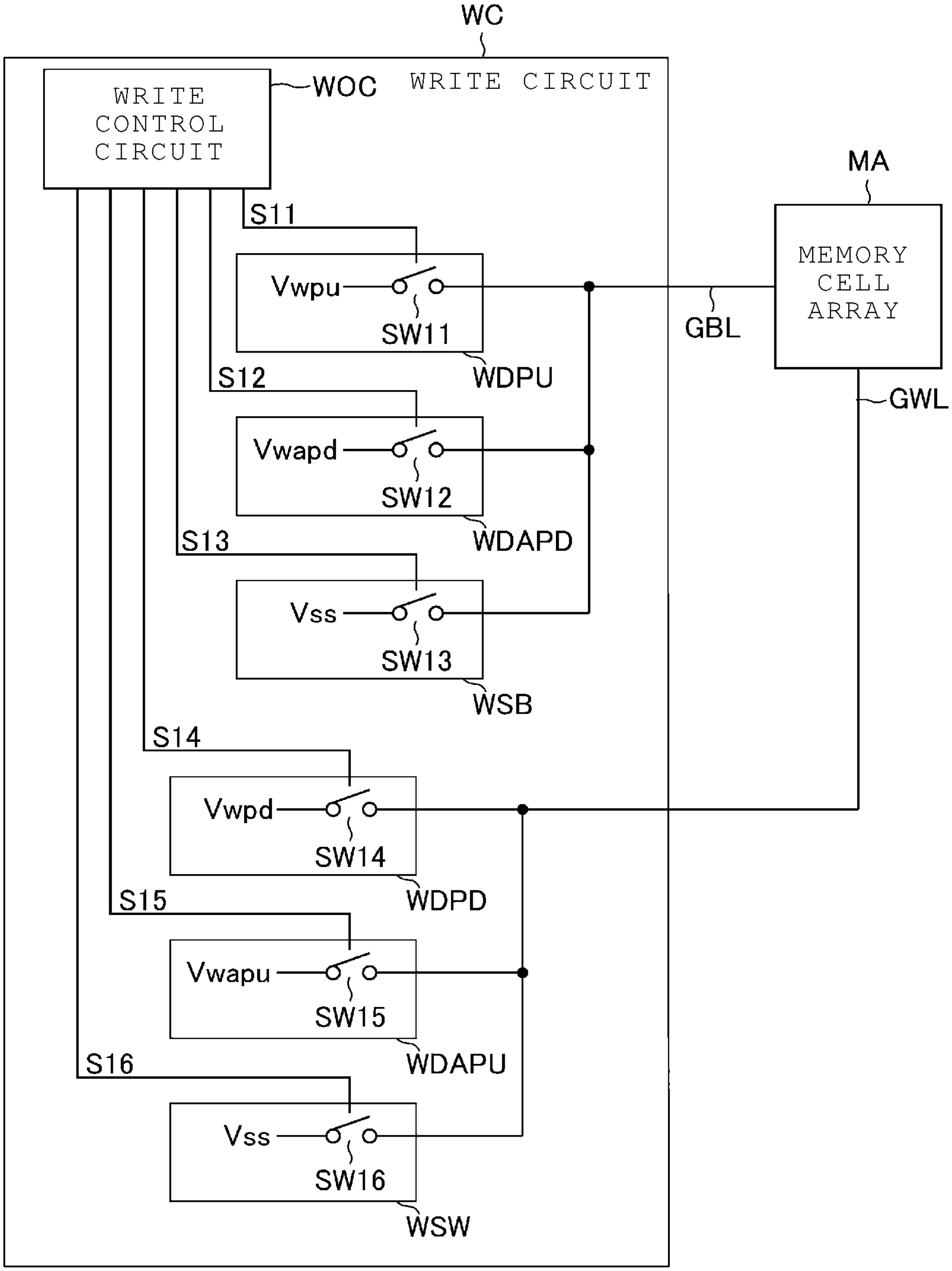
FIG. 10 is a diagram showing components of a write circuit of the first embodiment and connections between the components.

FIG. 10 shows the components of the write circuit of the first embodiment and the connections between the components. As shown in FIG. 10, the write circuit WC includes a write control circuit WOC, driver circuits WDPU, WDAPD, WDPD, and WDAPU, and sink circuits WSB and WSW. FIG. 10 shows only the components for one global bit line GBL and one global word line GWL. The driver circuits WDPU and WDAPD, and the sink circuit WSB are also provided for other global bit lines GBL. In addition, the driver circuits WDPD and WDAPU, and the sink circuit WSW are also provided for other global word lines GWL.

The driver circuit WDPU is configured so that an upper P write voltage Vwpu can be applied to the global bit line GBL. The upper P write voltage Vwpu has a magnitude that allows an upper P write current Iwpu to flow through the write target upper memory cell MCB when it is applied to the write target upper memory cell MCB via wiring. The magnitude of the upper P write current Iwpu will be described later. The driver circuit WDPU may have any configuration as long as the upper P write voltage Vwpu can be applied to the global bit line GBL. For example, the driver circuit WDPU includes a switch circuit SW11. The switch circuit SW11 is connected to the global bit line GBL at one end and to the node to which the upper P write voltage Vwpu is applied in the memory device 1 at the other end. The switch circuit SW11 turns on or off based on the control signal S11 and transfers the upper P write voltage Vwpu to the global bit line GBL. The switch circuit SW11 receives, for example, the control signal S11 from the write control circuit WOC. The switch circuit SW11 is, for example, a MOSFET.

The driver circuit WDAPD is configured so that a lower AP write voltage Vwapd can be applied to the global bit line GBL. The lower AP write voltage Vwapd has a magnitude that allows a lower AP write current Iwapd to flow through the write target lower memory cell MCA when it is applied to the write target lower memory cell MCA via wiring. The magnitude of the lower AP write current Iwapd will be described later. The driver circuit WDAPD may have any configuration as long as the lower AP write voltage Vwapd can be applied to the global bit line GBL. For example, the driver circuit WDAPD includes a switch circuit SW12. The switch circuit SW12 is connected to the global bit line GBL at one end and to the node to which the lower AP write voltage Vwapd is applied in the memory device 1 at the other end. The switch circuit SW12 turns on or off based on the control signal S12 and transfers the lower AP write voltage Vwapd to the global bit line GBL. The switch circuit SW12 receives, for example, the control signal S12 from the write control circuit WOC. The switch circuit SW12 is, for example, a MOSFET.

The sink circuit WSB is configured so that the ground voltage Vss can be applied to the global bit line GBL. The sink circuit WSB may have any configuration as long as the ground voltage Vss can be applied to the global bit line GBL. For example, the sink circuit WSB includes a switch circuit SW13. The switch circuit SW13 is connected to the global bit line GBL at one end and to the node to which the ground voltage Vss is applied in the memory device 1 at the other end. The switch circuit SW13 turns on or off based on the control signal S13 and transfers the ground voltage Vss to the global bit line GBL. The switch circuit SW13 receives, for example, the control signal S13 from the write control circuit WOC. The switch circuit SW13 is, for example, a MOSFET.

The driver circuit WDPD is configured so that a lower P write voltage Vwpd can be applied to the global word line GWL. The lower P write voltage Vwpd has a magnitude that allows a lower P write current Iwpd to flow through the write target lower memory cell MCA when it is applied to the write target lower memory cell MCA via wiring. The magnitude of the lower P write current Iwpd will be described later. The driver circuit WDPD may have any configuration as long as the lower P write voltage Vwpd can be applied to the global word line GWL. For example, the driver circuit WDPD includes a switch circuit SW14. The switch circuit SW14 is connected to the global word line GWL at one end and to the node to which the lower P write voltage Vwpd is applied in the memory device 1 at the other end. The switch circuit SW14 turns on or off based on the control signal S14 and transfers the lower P write voltage Vwpd to the global word line GWL. The switch circuit SW14 receives, for example, the control signal S14 from the write control circuit WOC. The switch circuit SW14 is, for example, a MOSFET.

The driver circuit WDAPU is configured so that an upper AP write voltage Vwapu can be applied to the global word line GWL. The upper AP write voltage Vwapu has a magnitude that allows an upper AP write current Iwapu to flow through the write target upper memory cell MCB when it is applied to the write target upper memory cell MCB via wiring. The magnitude of the upper AP write current Iwapu will be described later. The driver circuit WDAPU may have any configuration as long as the upper AP write voltage Vwapu can be applied to the global word line GWL. For example, the driver circuit WDAPU includes a switch circuit SW15. The switch circuit SW15 is connected to the global word line GWL at one end and to the node to which the upper AP write voltage Vwapu is applied in the memory device 1 at the other end. The switch circuit SW15 turns on or off based on the control signal S15 and transfers the upper AP write voltage Vwapu to the global word line GWL. The switch circuit SW15 receives, for example, the control signal S15 from the write control circuit WOC. The switch circuit SW15 is, for example, a MOSFET.

The sink circuit WSW is configured so that the ground voltage Vss can be applied to the global word line GWL. The sink circuit WSW may have any configuration as long as the ground voltage Vss can be applied to the global word line GWL. For example, the sink circuit WSW includes a switch circuit SW16. The switch circuit SW16 is connected to the global word line GWL at one end and to the node to which the ground voltage Vss is applied in the memory device 1 at the other end. The switch circuit SW16 turns on or off based on the control signal S16 and transfers the ground voltage Vss to the global word line GWL. The switch circuit SW16 receives, for example, the control signal S16 from the write control circuit WOC. The switch circuit SW16 is, for example, a MOSFET.

1.2. Operation 1.2.1. Data Writing

Figure 11:
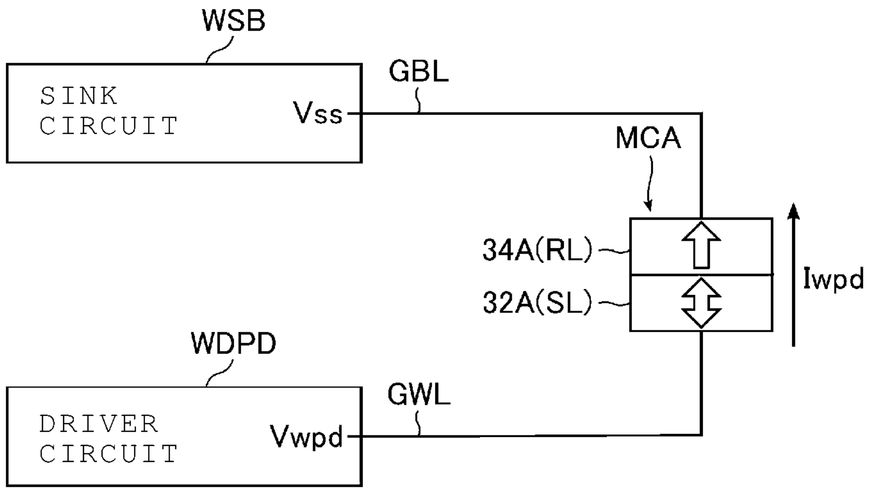
FIGS. 11-14 are diagrams showing components related to data writing during data writing in the memory device of the first embodiment and connections between the components.
Figure 12:
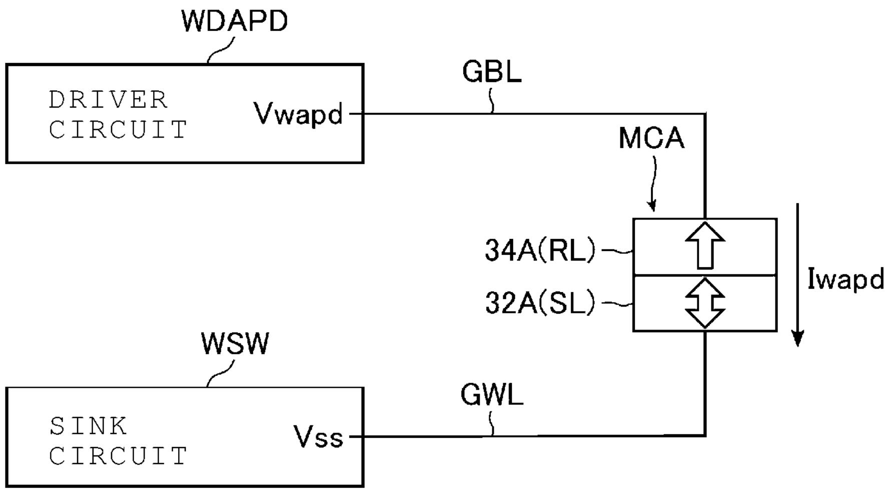
Figure 13:
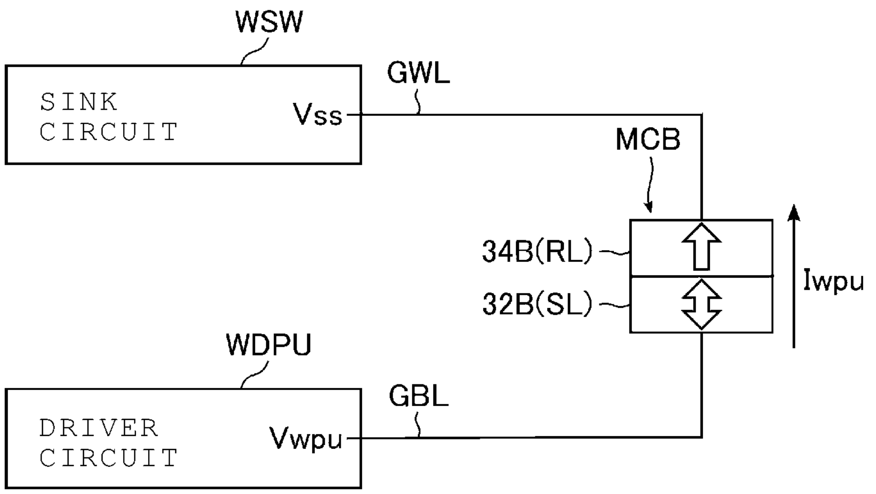
Figure 14:
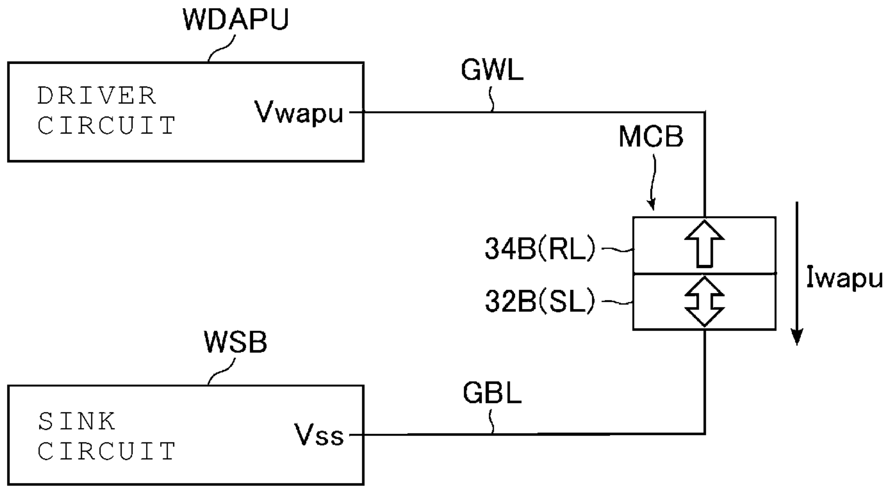

FIGS. 11 to 14 show components related to data writing during data writing in the memory device 1 of the first embodiment and the connection of the components. FIG. 11 shows a state while the MTJ element MTJA of the lower memory cell MCA is in the P state. FIG. 12 shows a state while the MTJ element MTJA of the lower memory cell MCA is in the AP state. FIG. 13 shows a state while the MTJ element MTJB of the upper memory cell MCB is in the P state. FIG. 14 shows a state while the MTJ element MTJB of the upper memory cell MCB is in the AP state. FIGS. 11 to 14 show only the storage layer 32 and the reference layer 34 of the write target memory cells MC.

As shown in FIG. 11, in order to put the MTJ element MTJA of a certain write target lower memory cell MCA into the P state, the write target lower memory cell MCA is connected to the global bit line GBL via the conductor 22 (local bit line LBL) and is connected to the global word line GWL via the conductor 21 (local word line LWLA). Further, the lower P write voltage Vwpd is applied to the global word line GWL by the driver circuit WDPD and the ground voltage Vss is applied to the global bit line GBL by the sink circuit WSB. As a result, the lower P write current Iwpd flows from the storage layer 32A toward the reference layer 34A in the write target lower memory cell MCA. As a result, the MTJ element MTJA of the write target lower memory cell MCA is in the P state.

As shown in FIG. 12, in order to put the MTJ element MTJA of a certain write target lower memory cell MCA into the AP state, the write target lower memory cell MCA is connected to the global bit line GBL via the conductor 22 (local bit line LBL) and is connected to the global word line GWL via the conductor 21 (local word line LWLA). Further, the lower AP write voltage Vwapd is applied to the global bit line GBL by the driver circuit WDAPD, and the ground voltage Vss is applied to the global word line GWL by the sink circuit WSW. As a result, the lower AP write current Iwapd flows from the reference layer 34A to the storage layer 32A in the write target lower memory cell MCA. As a result, the MTJ element MTJA of the write target lower memory cell MCA is in the AP state.

As shown in FIG. 13, in order to put the MTJ element MTJB of a certain write target upper memory cell MCB into the P state, the write target upper memory cell MCB is connected to the global bit line GBL via the conductor 22 (local bit line LBL) and is connected to the global word line GWL via the conductor 23 (local word line LWLB). Further, the upper P write voltage Vwpu is applied to the global bit line GBL by the driver circuit WDPU, and the ground voltage Vss is applied to the global word line GWL by the sink circuit WSW. As a result, the upper P write current Iwpu flows from the storage layer 32B toward the reference layer 34B in the write target upper memory cell MCB. As a result, the MTJ element MTJB of the write target upper memory cell MCB is in the P state.

As shown in FIG. 14, in order to put the MTJ element MTJB of a certain write target upper memory cell MCB into the AP state, the write target upper memory cell MCB is connected to the global bit line GBL via the conductor 22 (local bit line LBL) and is connected to the global word line GWL via the conductor 23 (local word line LWLB). Further, the upper AP write voltage Vwapu is applied to the global word line GWL by the driver circuit WDAPU, and the ground voltage Vss is applied to the global bit line GBL by the sink circuit WSB. As a result, the upper AP write current Iwapu flows from the reference layer 34B toward the storage layer 32B in the write target upper memory cell MCB. As a result, the MTJ element MTJB of the write target upper memory cell MCB is in the AP state.

1.2.2. Data Reading

Figure 15:
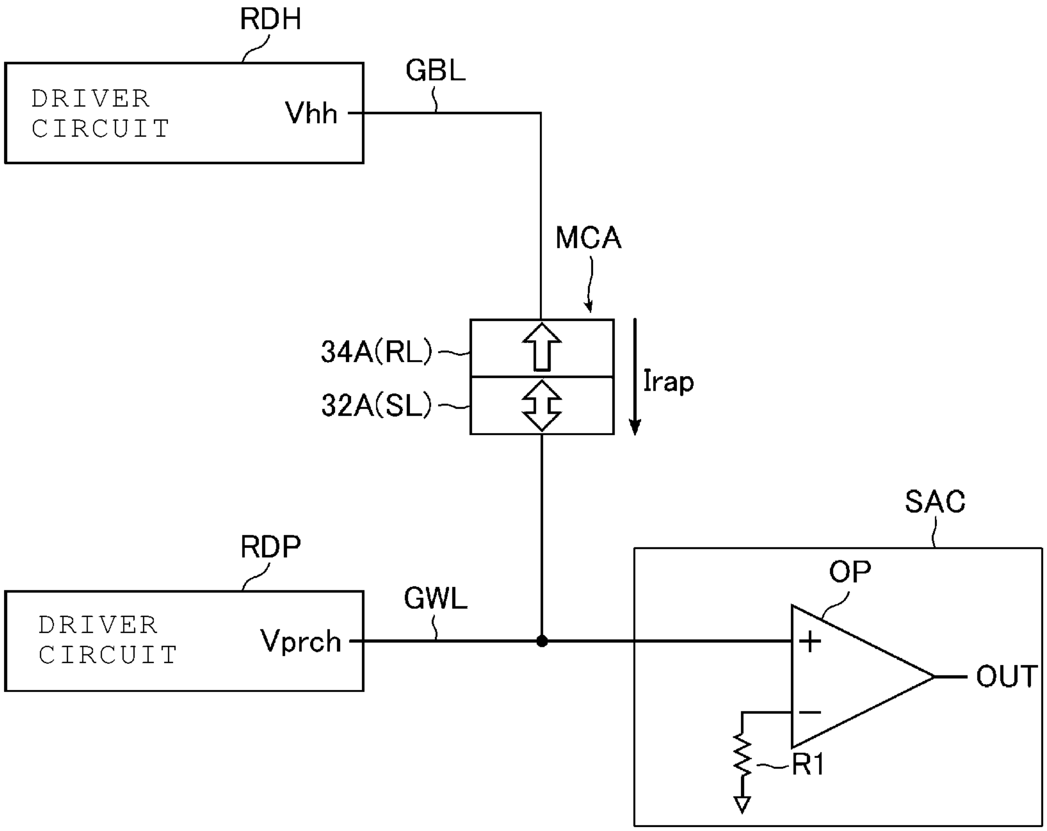
FIGS. 15-16 are diagrams showing components related to data reading during data reading in the memory device of the first embodiment and connections between the components.
Figure 16:
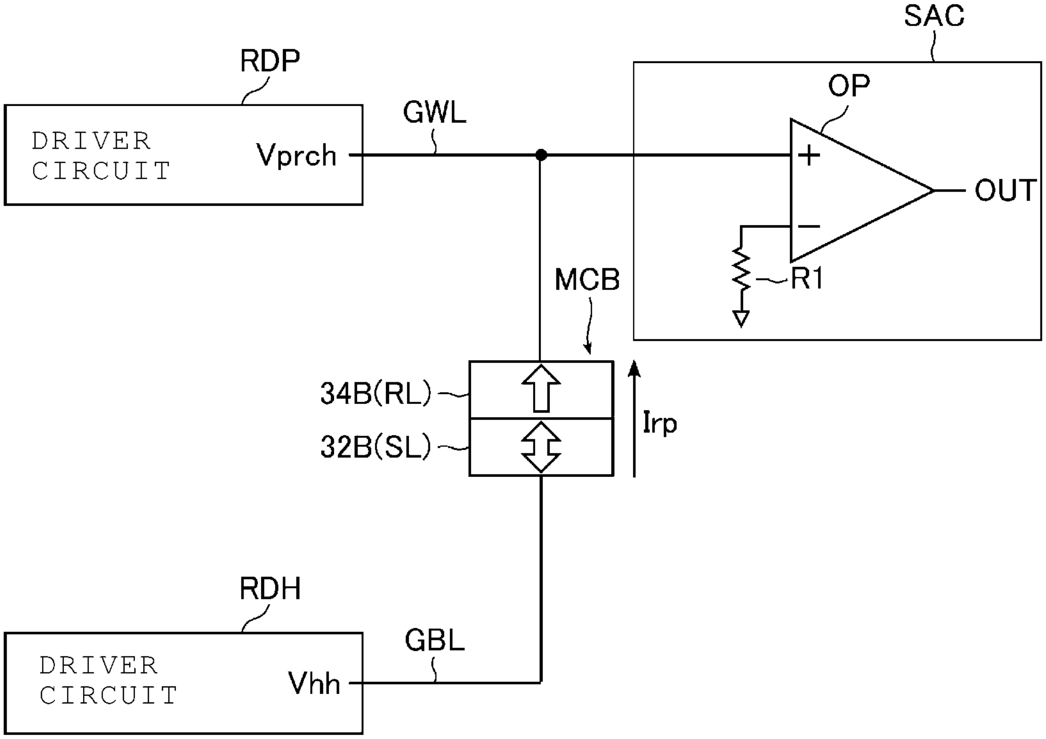

FIGS. 15 and 16 show components related to data reading during data reading in the memory device 1 of the first embodiment and connections between the components. FIG. 15 shows the state during data reading from the lower memory cell MCA. FIG. 16 shows the state during data reading from the upper memory cell MCB.

Also, at the start of the data reading, the global bit line GBL is applied with the non-selection voltage Vusel by the driver circuit RDUB (not shown), and the global word line GWL is applied with the non-selection voltage Vusel by the driver circuit RDUW (not shown). Therefore, there is no voltage difference between the global word line GWL and the global bit line GBL.

As shown in FIG. 15, when the data reading from the read target lower memory cell MCA is started, the read target lower memory cell MCA is connected to the global bit line GBL via the local bit line LBL (conductor 22) and is connected to the global word line GWL via the local word line LWLA (conductor 21).

Furthermore, the precharge voltage Vprch is applied to the global word line GWL by the driver circuit RDP. As a result, the global word line GWL is charged with the precharge voltage Vprch. After that, the global word line GWL is disconnected from the driver circuit RDP and the global word line GWL is placed in an electrically floating state. In this state, the power supply voltage Vhh is applied to the global bit line GBL by the driver circuit RDH. As a result, a voltage having the magnitude of Vhh−Vprch is applied to both ends of the read target lower memory cell MCA. This voltage has a magnitude that turns on the switching element SEA of the read target lower memory cell MCA. Therefore, a read current Irap flows from the reference layer 34A toward the storage layer 32A, that is, in the AP direction. The read current Irap charges the global word line GWL and raises the voltage of the global word line GWL. As the voltage of the global word line GWL increases, the voltage difference between both ends of the read target lower memory cell MCA decreases.

When the voltage difference between both ends of the read target lower memory cell MCA drops to a certain magnitude, the switching element SEA of the read target lower memory cell MCA turns off. As a result, the voltage of the global word line GWL when the switching element SEA of the read target lower memory cell MCA is turned off is stored in the node of the non-inverting input terminal of the operational amplifier OP. The stored voltage is one of the low hold voltage VhdL and the high hold voltage VhdH based on the resistance state of the read target lower memory cell MCA. An output OUT that reflects the data stored in the read target lower memory cell MCA is output based on the stored voltage and the voltage of the inverting input terminal of the operational amplifier OP.

As shown in FIG. 16, when the data reading from the read target upper memory cell MCB is started, the read target upper memory cell MCB is connected to the global bit line GBL via the local bit line LBL (conductor 22) and is connected to the global word line GWL via the local word line LWLB (conductor 23).

Furthermore, the precharge voltage Vprch is applied to the global word line GWL by the driver circuit RDP. As a result, the global word line GWL is charged with the precharge voltage Vprch. After that, the global word line GWL is disconnected from the driver circuit RDP and the global word line GWL is placed in an electrically floating state. In this state, the power supply voltage Vhh is applied to the global bit line GBL by the driver circuit RDH. As a result, a voltage having the magnitude of Vhh−Vprch is applied to both ends of the read target upper memory cell MCB. Due to this voltage, a read current Irp flows from the storage layer 32B toward the reference layer 34B, that is, in the P direction. The read current Irp charges the global word line GWL and raises the voltage of the global word line GWL. As the voltage of the global word line GWL increases, the voltage difference between both ends of the read target upper memory cell MCB decreases.

When the voltage difference between both ends of the read target upper memory cell MCB drops to a certain magnitude, the switching element SEB of the read target upper memory cell MCB turns off. As a result, one of the low hold voltage VhdL and the high hold voltage VhdH based on the resistance state of the read target upper memory cell MCB is stored in the node of the non-inverting input terminal of the operational amplifier OP. An output OUT that reflects the data stored in the read target upper memory cell MCB is output based on the stored voltage and the voltage of the non-inverting input terminal of the operational amplifier OP.

1.2.3. Magnitude of Current

Figure 17A:
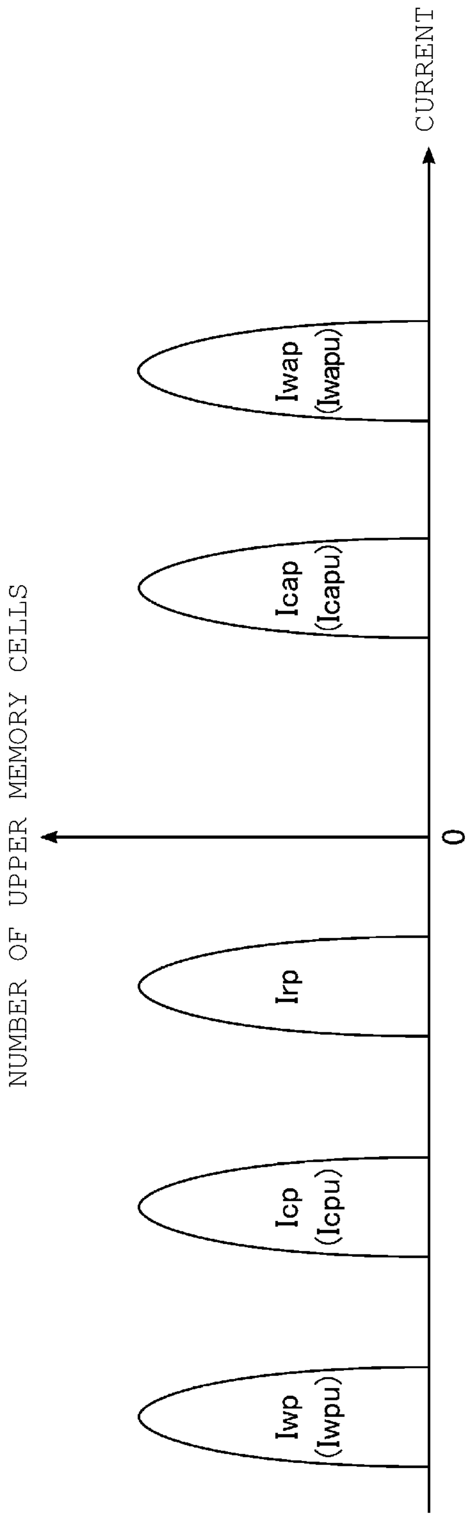
FIGS. 17A and 17B are diagrams showing the magnitude of current flowing during various operations in the memory device of the first embodiment.
Figure 17B:
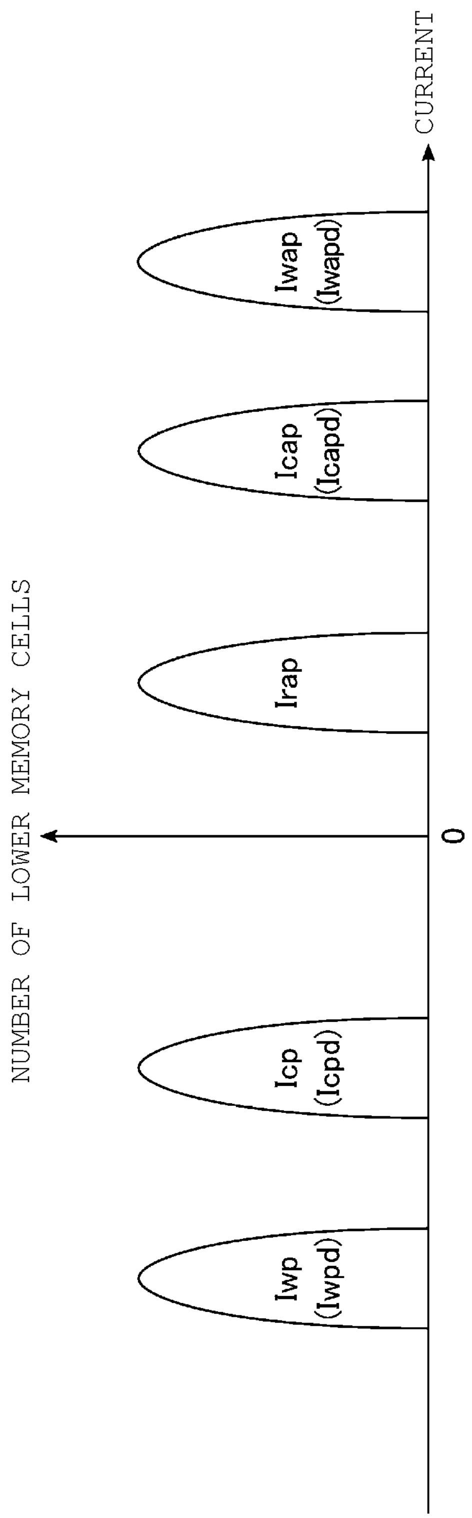

FIGS. 17A and 17B show the magnitude of the current flowing during various operations in the memory device 1 of the first embodiment. Specifically, FIGS. 17A and 17B show the write current and the read current for each of the upper memory cell MCB and the lower memory cell MCA. FIG. 17A shows the upper memory cell MCB and FIG. 17B shows the lower memory cell MCA. FIGS. 17A and 17B also show the upper P-direction switching current Icpu, the upper AP-direction switching current Icapu, the lower P-direction switching current Icpd, and the lower AP-direction switching current Icapd shown in FIGS. 7A and 7B.

In order to change the resistance state of the memory cell MC, a write current having a magnitude larger than the magnitude of the switching current of the memory cell MC needs to flow through this memory cell MC. The write current that actually flows through the memory cell MC depends on the characteristics of the write circuit and/or the characteristics of the memory cell MC. Therefore, the write current that actually flows through the memory cell MC differs for each memory cell MC and is therefore distributed over a certain range. Similarly, the read current flowing through the memory cell MC depends on the characteristics of the readout circuit and/or the characteristics of the memory cell MC. Therefore, the read current that actually flows through the memory cell MC differs for each memory cell MC and is therefore distributed over a certain range.

As shown in FIG. 17B, the magnitude of the lower AP write current Iwapd is larger than the magnitude of the lower AP-direction switching current Icapd. That is, the minimum magnitude lower AP write current Iwapd is greater than the maximum magnitude lower AP-direction switching current Icapd. The magnitude of the lower P write current Iwpd is greater than the magnitude of the lower P-direction switching current Icpd. That is, the lower P write current Iwpd having the minimum magnitude is greater than the lower P-direction switching current Icpd having the maximum magnitude.

As shown in FIG. 17A, the magnitude of the upper AP write current Iwapu is larger than the magnitude of the upper AP-direction switching current Icapu. That is, the upper AP write current Iwapu having the minimum magnitude is larger than the upper AP-direction switching current Icapu having the maximum magnitude. The magnitude of the upper P write current Iwpu is larger than the magnitude of the upper P-direction switching current Icpu. That is, the upper P write current Iwpu having the minimum magnitude is larger than the upper P-direction switching current Icpu having the maximum magnitude.

As shown in FIGS. 17A and 17B and described with reference to FIGS. 7A and 7B, the magnitude of the upper AP-direction switching current Icapu is smaller than the magnitude of the lower AP-direction switching current Icapd. Since the magnitude of the upper AP-direction switching current Icapu is smaller than the magnitude of the lower AP-direction switching current Icapd, the magnitude of the upper AP write current Iwapu may be smaller than the magnitude of the lower AP write current Iwapd. Therefore, the magnitude of the upper AP write current Iwapu is smaller than the magnitude of the lower AP write current Iwapd. That is, the distribution of the upper AP write current Iwapu is located closer to the origin on the horizontal axis than the distribution of the lower AP write current Iwapd. For example, the maximum magnitude of the upper AP write current Iwapu is smaller than the maximum magnitude of the lower AP write current Iwapd, and/or the minimum magnitude of the upper AP write current Iwapu is smaller than the minimum magnitude of the lower AP write current Iwapd.

Also, as shown in FIGS. 17A and 17B and described with reference to FIGS. 7A and 7B, the magnitude of the upper P-direction switching current Icpu is larger than the magnitude of the lower P-direction switching current Icpd. Since the magnitude of the upper P-direction switching current Icpu is larger than the magnitude of the lower P-direction switching current Icpd, the magnitude of the upper P write current Iwpu is larger than the magnitude of the lower P write current Iwpd. That is, the distribution of the upper P write current Iwpu is located farther from the origin on the horizontal axis than the distribution of the lower P write current Iwpd. For example, the maximum magnitude of the upper P write current Iwpu is larger than the maximum magnitude of the lower P write current Iwpd, and/or the minimum magnitude of the upper P write current Iwpu is larger than the minimum magnitude of the lower P write current Iwpd.

The current flowing through the memory cell MC can change the resistance state of the memory cell MC, that is, it can cause a read disturb in the memory cell MC. However, it is required that the read current does not change the resistance state of the memory cell MC even if the read current flows through the memory cell MC. For that purpose, if a certain read current flows through a certain memory cell MC in a first direction (AP direction or P direction), the magnitude of this read current is required to be smaller than the switching current in the first direction of this memory cell MC. Based on this, the read current Irap is smaller than the lower AP-direction switching current Icapd. That is, the distribution of the read current Irap is located closer to the origin on the horizontal axis than the distribution of the lower AP-direction switching current Icapd. For example, the maximum magnitude of the read current Irap is smaller than the minimum magnitude of the lower AP-direction switching current Icapd.

Also, the read current Irp is smaller than the upper P-direction switching current Icpu. That is, the distribution of the read current Irp is located closer to the origin on the horizontal axis than the distribution of the upper P-direction switching current Icpu. For example, the maximum magnitude of the read current Irp is smaller than the minimum magnitude of the upper P-direction switching current Icpu.

1.3. Advantages (Effects)

According to the first embodiment, as described below, it is possible to provide a memory device in which the read disturb is reduced and the variation in the data reading margin for each memory cell MC is reduced.

An outline of a memory device 100 is described for comparison and reference. The memory device 100 includes a memory cell 101A and a memory cell 101B in place of the lower memory cell MCA and the upper memory cell MCB in the memory device 1 of the first embodiment, respectively. The memory cell 101A and the memory cell 101B have the same structure as the memory cell MCA.

Generally, the switching current for putting the MTJ element in the AP state is larger than the switching current for putting the MTJ element in the P state. Therefore, in order to reduce the read disturb, it is conceivable to pass the read current in the AP direction.

Applying a voltage to a certain wiring by a driver circuit can be performed by various methods. As a first method, the voltage desired to be applied by the driver circuit is generated as described with reference to FIGS. 9 and 10, and the generated voltage is transferred to the wiring via the switch circuit SW. As a second method, a node having a reference voltage (for example, an internal power supply voltage or a ground voltage) different from the voltage desired to be transferred is connected to the wiring via a MOSFET. Then, by adjusting the voltage of the gate of the MOSFET, a voltage having a magnitude desired to be transferred, which is generated by raising or lowering the reference voltage, is applied to the wiring. When the second method is adopted in the memory device 100, the following phenomena may occur.

Figure 18:
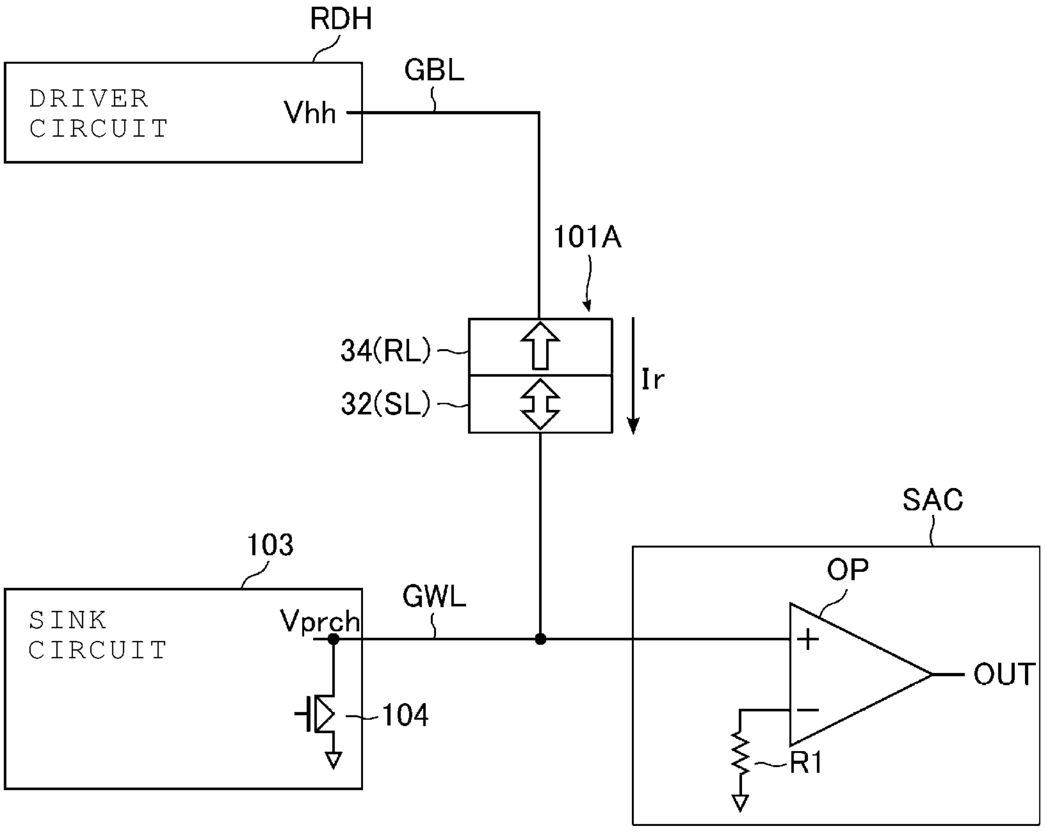
FIGS. 18-19 are diagrams showing components related to data reading during data reading in a memory device of a comparative example and connections between the components.
Figure 19:
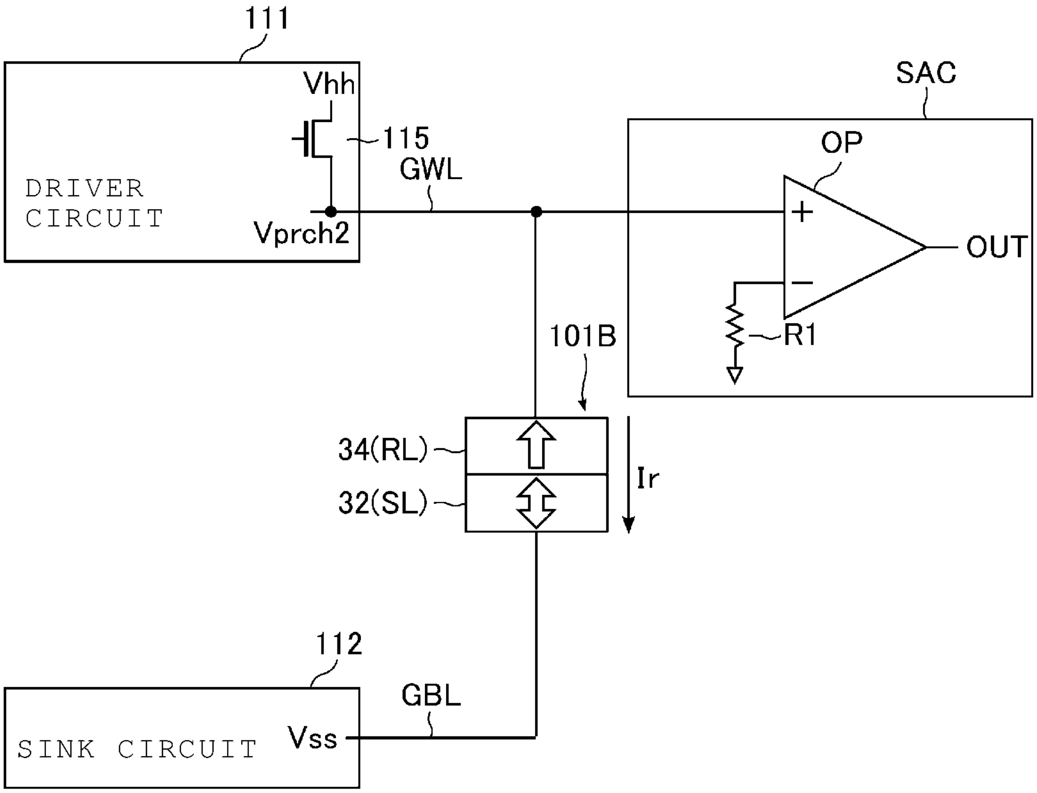

FIGS. 18 and 19 are similar to FIGS. 15 and 16 and show components related to data reading during data reading in the memory device 100 and connections between the components. FIG. 18 shows the state during data reading from the lower memory cell 101A. FIG. 19 shows the state during data reading from the upper memory cell 101B.

The case of reading data from the lower memory cell 101A is the same as that of the first embodiment (FIG. 15). That is, the global word line GWL is set to the precharge voltage Vprch, then placed in an electrically floating state, and then the power supply voltage Vhh is applied to the global bit line GBL. As a result, as shown in FIG. 18, the read current Ir flows through the memory cell 101A from the reference layer 34 toward the storage layer 32, that is, in the AP direction. A sink circuit 103 includes a p-type MOSFET 104 connected between the global word line GWL and the node having the ground voltage Vss.

Meanwhile, the read current in the AP direction can flow through the upper memory cell 101B by the following method. As shown in FIG. 19, the sense amplifier circuit SAC is connected to the global word line GWL as in the case of reading data from the lower memory cell 101A and the lower memory cell MCA of the first embodiment. The global word line GWL is charged with a precharge voltage Vprch2 by a driver circuit 111. The precharge voltage Vprch2 is higher than the non-selection voltage Vusel. After charging is completed, the global word line GWL is disconnected from the driver circuit 111 and placed in an electrically floating state. Next, the ground voltage Vss is applied to the global bit line GBL by a sink circuit 112. As a result, the read current Ir flows through the upper memory cell MCB from the reference layer 34 toward the storage layer 32, that is, in the AP direction.

The direction of the read current Ir when the global word line GWL is used as the reference is different in the case of reading data from the lower memory cell 101A and the case of reading data from the upper memory cell 101B. Due to this, the combination of the wiring and the transistor including the path through which the read current Ir flows differs in the cases of FIGS. 18 and 19. One of the differences is the type of transistor connected to the global word line GWL. That is, in the case of FIG. 18, the p-type MOSFET 104 is connected to the global word line GWL, and in the case of FIG. 19, the n-type MOSFET 115 is connected to the global word line GWL. This functions as a difference in the characteristics of the components connected to the operational amplifier OP for the operational amplifier OP connected to the global word line GWL. The difference in characteristics for the operational amplifier OP leads to the operation by the operational amplifier OP being different in the cases of FIGS. 18 and 19, that is, depending on the position of the memory cell 101. This causes variations in the characteristics of data reading in the memory device 100.

As a countermeasure against this, it is conceivable to pass the read current Ir in the P direction to the upper memory cell 101B. In this case, the distribution of each current in the upper memory cell 101B is the same as the distribution for the lower memory cell MCA shown in FIGS. 17A and 17B. When a read current in the P direction flows to the upper memory cell 101B having such a distribution, the distribution of the P-direction switching current Icpu of the upper memory cell 101B (the same as the distribution of the P-direction switching current Icp of the lower memory cell 101A) partially overlaps with the P direction read current distribution (the same as the P-direction read current Irp distribution of the upper memory cell 101B). This can cause a read disturb due to the read current Ir in the P direction.

Alternatively, the following measures can be considered against variations in the characteristics of data reading in the memory device 100. That is, the order of the materials (layers) located from the conductor 22 (local bit line LBL)

toward the conductor 21 (local word line LWLA) is the same as the order of the materials (layers) located from the conductor 22 toward the conductor 23 (local word line LWLB). That is, the order in which the layers of the memory cell 101A are located and the order in which the layers of the memory cell 101B are located are line-symmetrical with respect to the conductor 22. By doing so, a read current in the AP direction flows from the local bit line LBL toward the local word line LWL in any of the memory cells 101A and 101B. However, changing the order in which the layers of the memory cells 101 are located can change the characteristics of the memory cells 101A and 101B. That is, the memory cell 101 has the shape of a truncated cone due to the limitation of the manufacturing process and the like, and the layer located above the truncated cone has a smaller volume than that of the layer located below the truncated cone even with the same thickness. This leads to the characteristics of the storage layer, the reference layer, and/or the switching element being different in the memory cells 101A and 101B. This greatly varies the characteristics of the memory cell 101.

According to the first embodiment, the lower memory cell MCA and the upper memory cell MCB include substantially the same plurality of layers located in the same order along the z-axis. That is, in both the lower memory cell MCA and the upper memory cell MCB, the switching element SE, the storage layer 32, the reference layer 34, and the shift cancel layer 41 or 43 are located in this order in the direction in which the z-axis coordinate increase (+z direction). In addition, the shift cancel layer 43 of the upper memory cell MCB has a volume larger than the volume of the shift cancel layer 41 of the lower memory cell MCA. Therefore, the magnitude of the upper P-direction switching current Icpu is larger than the magnitude of the upper P-direction switching current (that is, the magnitude of the lower P-direction switching current Icpd) when the shift cancel layer 43 has the same volume as the shift cancel layer 41. Utilizing this fact, it is possible to pass a read current in the P direction to the upper memory cell MCB for reading data from the upper memory cell MCB. Since the magnitude of the upper P-direction switching current Icpu is larger than the magnitude of the upper P-direction switching current when the shift cancel layer 43 has the same volume as the shift cancel layer 41, the MTJ element MTJB of the upper memory cell MCB is prevented from going into the P state even if a read current flows through the upper memory cell MCB in the P direction.

Since the read current Ir can flow through the upper memory cell MCB in the P direction, as is clear from FIGS. 15 and 16, the direction of the read current when the global word line GWL is used as a reference is the same in the case of reading data from the lower memory cell MCA and in the case of reading data from the upper memory cell MCB. That is, the read current flows toward the global word line GWL. This brings the advantages described below.

Figure 20:
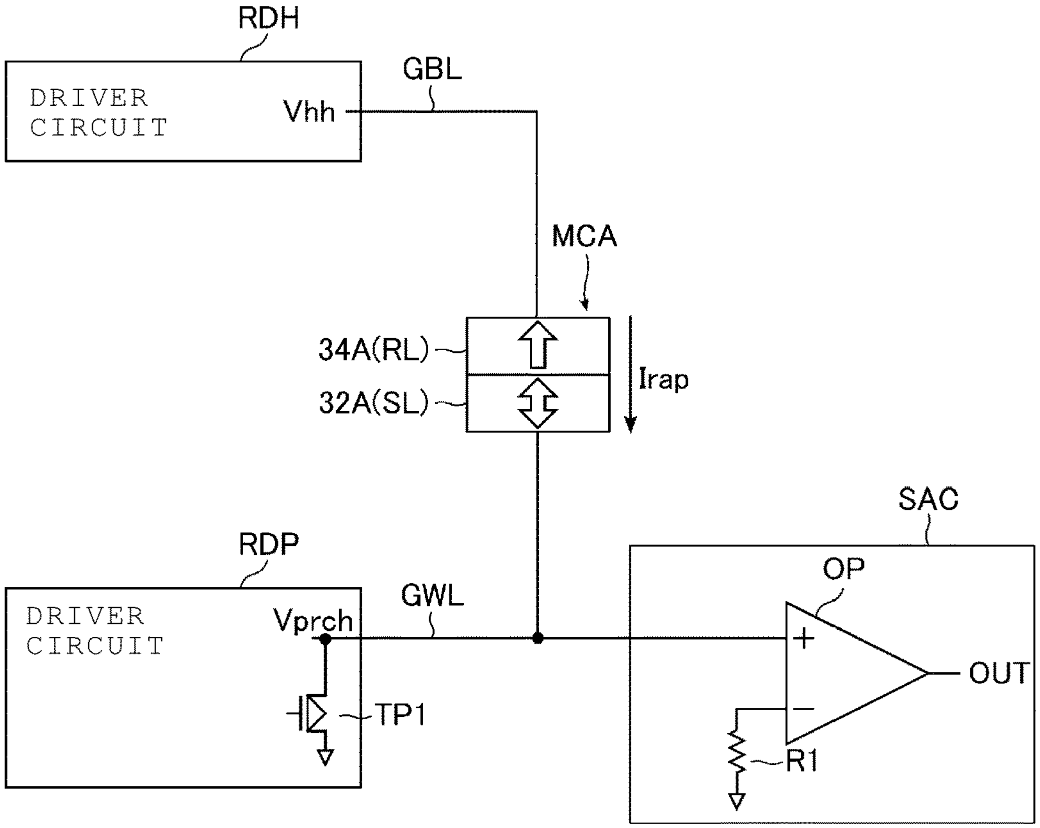
FIGS. 20-21 are diagrams showing a detailed example of components related to data reading during data reading in the memory device of the first embodiment and the connections between the components.
Figure 21:
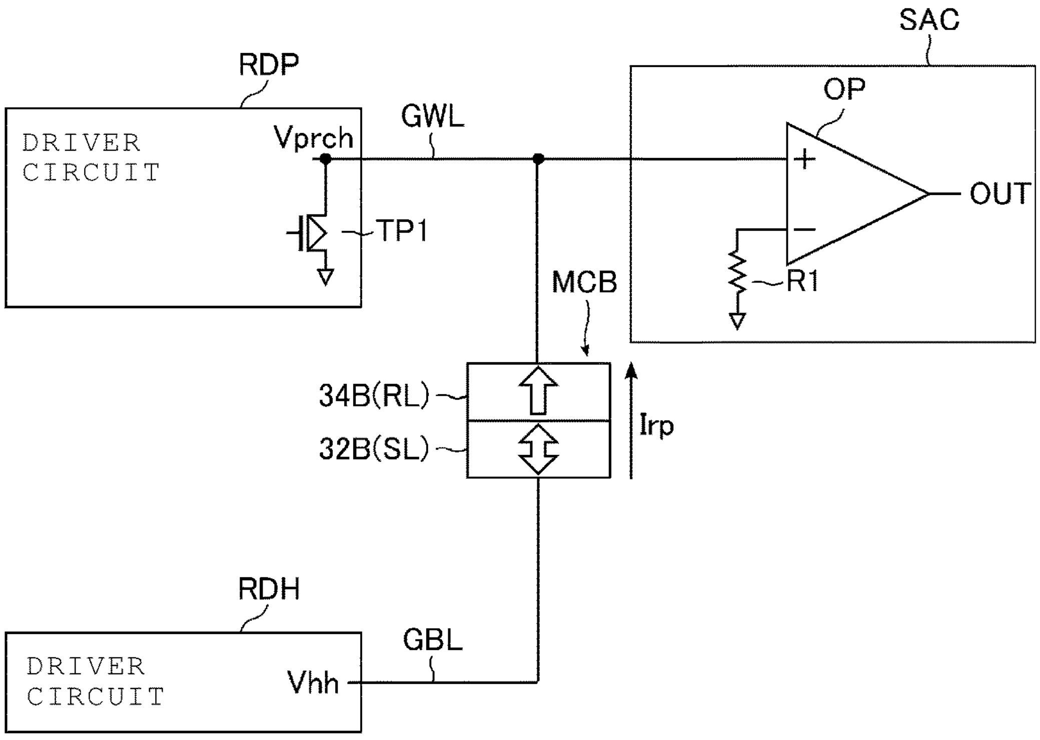

FIGS. 20 and 21 show components related to data reading during data reading in the memory device 1 of the first embodiment and connections between the components, and show examples of the components and connections of FIGS. 15 and 16, respectively. As shown in FIGS. 20 and 21, the driver circuit RDP includes a p-type MOSFET TP1. The transistor TP1 is connected to the global word line GWL at one end and to the node having the ground voltage Vss at the other end. At the gate, the transistor TP1 receives a control signal from a part other than the driver circuit RDP of the readout circuit RC.

As can be seen from FIGS. 20 and 21, the combinations of wiring and transistors including the path through which the read current Ir flows are the same in the case of reading data from the lower memory cell MCA and in the case of reading data from the upper memory cell MCB. This means that for the operational amplifier OP connected to the global word line GWL, the difference in the characteristics of the components connected to the operational amplifier OP is reduced. The reduction of this difference leads to the fact that the variation in operation due to the operational amplifier OP is reduced in the case of reading data from the lower memory cell MCA and in the case of reading data from the upper memory cell MCB. Therefore, it is possible to provide the memory device 1 in which the variation in the characteristics of data reading based on the position of the memory cell MC is reduced.

Since the upper AP-direction switching current Icapu is small as described with reference to FIGS. 7A and 7B, the distribution of the upper AP-direction switching current Icapu has very little spacing or partially overlaps with the read current Irap in the AP direction, as can be seen from FIGS. 17A and 17B. However, the read current in the AP direction does not flow in the upper memory cell MCB. Therefore, read disturb in the upper memory cell MCB does not occur.

1.4. Modification

Data determination by the sense amplifier circuit SAC is not limited to the form described above. For example, the global word line GWL is connected to the non-inverting input terminal of the operational amplifier via the first switch circuit. The global word line GWL is also connected to the input of a voltage adjustment circuit via the second switch circuit. The voltage adjustment circuit adjusts the input voltage and supplies the adjusted voltage to the inverting input terminal of the operational amplifier OP. The adjustment is made so that the adjusted voltage has a magnitude between, for example, the low hold voltage VhdL and the high hold voltage VhdH.

At the time of data reading, the same data reading as described with reference to FIGS. 15 and 16 is performed with the first switch circuit turned on and the second switch circuit turned off. As a result, one of the low hold voltage VhdL and the high hold voltage VhdH based on the resistance state of the read target lower memory cell MCA appears on the global word line GWL. Then, when the first switch circuit is turned off, the voltage of the global word line GWL is held at the node of the non-inverting input terminal of the operational amplifier OP. The held voltage is referred to as a first sample voltage.

Next, the predetermined reference data is written to the read target memory cell MC. The reference data may be “1” data or “0” data, for example, “0” data. After writing, the same data reading as described with reference to FIGS. 15 and 16 are performed with the first switch circuit turned off and the second switch circuit turned on. As a result, the low hold voltage VhdL appears on the global word line GWL. After that, when the second switch circuit is turned off, the voltage adjusted for the voltage of the global word line GWL is held in the node of the inverting input terminal of the operational amplifier OP. The held voltage is referred to as a second sample voltage.

The operational amplifier OP outputs a value based on the magnitude of the first sample voltage and the second sample voltage. If the first sample voltage is smaller than the second sample voltage, the operational amplifier OP outputs an “L” level voltage. This is treated as if the data read target memory cell MC held the same “0” data as the reference data. Meanwhile, when the first sample voltage is larger than the second sample voltage, the operational amplifier OP outputs an "H" level voltage. This is treated as if the data read target memory cell MC held "1" data different from the reference data.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device comprising:

a first conductor;

a first stacked body having a bottom surface in contact with an upper surface of the first conductor, the first stacked body including a first variable resistance element, a first ferromagnetic layer, a first insulating layer, a second ferromagnetic layer, a non-magnetic first metal layer, and a third ferromagnetic layer stacked in order from a side of the first conductor, wherein the second ferromagnetic layer and the third ferromagnetic layer have magnetizations in opposite directions;

a second conductor having a bottom surface in contact with an upper surface of the first stacked body;

a second stacked body having a bottom surface in contact with an upper surface of the second conductor, the second stacked body including a second variable resistance element, a fourth ferromagnetic layer, a second insulating layer, a fifth ferromagnetic layer, a non-magnetic second metal layer, and a sixth ferromagnetic layer stacked in order from a side of the second conductor, wherein the fifth ferromagnetic layer and the sixth ferromagnetic layer have magnetizations in opposite directions, and the sixth ferromagnetic layer has a volume larger than a volume of the third ferromagnetic layer; and a third conductor having a bottom surface in contact with an upper surface of the second stacked body.

2. The memory device according to claim 1, wherein the sixth ferromagnetic layer includes a first portion that has substantially the same thickness as the third ferromagnetic layer and a second portion stacked on top of the first portion.

3. The memory device according to claim 2, wherein the second ferromagnetic layer and the third ferromagnetic layer are anti-ferromagnetically coupled, and the fifth ferromagnetic layer and the sixth ferromagnetic layer are anti-ferromagnetically coupled.

4. The memory device according to claim 3, wherein the first metal layer has a thickness that allows the second ferromagnetic layer and the third ferromagnetic layer to be anti-ferromagnetically coupled, and the second metal layer has a thickness that allows the fifth ferromagnetic layer and the sixth ferromagnetic layer to be anti-ferromagnetically coupled.

5. The memory device according to claim 1, further comprising:

a first circuit connected to the first conductor and the second conductor to allow a current to flow from the second ferromagnetic layer toward the first ferromagnetic layer, and connected to the second conductor and the third conductor to allow a current to flow from the fourth ferromagnetic layer to the fifth ferromagnetic layer.

6. The memory device according to claim 5, further comprising:

a first sense amplifier circuit connected to the first conductor; and a second sense amplifier circuit connected to the third conductor.

7. The memory device according to claim 6, wherein the first circuit includes a first driver circuit configured to apply a first voltage to the first conductor, a second driver circuit configured to apply a second voltage higher than the first voltage to the second conductor, and a third driver circuit configured to apply a third voltage lower than the second voltage to the third conductor.

8. The memory device according to claim 7, wherein the first driver circuit includes a p-type first MOSFET connected between the first conductor and a node having a fourth voltage lower than the first voltage, and the third driver circuit includes a p-type second MOSFET connected between the third conductor and a node having the fourth voltage.

9. The memory device according to claim 1, wherein the first stacked body and the second stacked body are each a magnetic tunnel junction element, and the first stacked body goes into a low resistance state in response to a current having at least a first magnitude flowing therethrough in a direction from the first conductor to the second conductor, and the second stacked body goes into a low resistance state in response to a current of at least a second magnitude, which is larger than the first magnitude, flowing therethrough in a direction from the second conductor to the third conductor.

10. The memory device according to claim 9, wherein the first stacked body goes into a high resistance state in response to a current having at least a third magnitude flowing therethrough in a direction from the second conductor to the first conductor, and the second stacked body goes into a high resistance state in response to a current of at least a fourth magnitude, which is smaller than the third magnitude, flowing therethrough in a direction from the third conductor to the second conductor.

11. A memory device comprising:

a plurality of first word lines extending in a first direction;

a plurality of bit lines above the first word lines and extending in a second direction crossing the first direction;

a plurality of second word lines above the bit lines and extending in the first direction;

a plurality of lower memory cells, each of which is located between one of the first word lines and one of the bit lines; and a plurality of upper memory cells, each of which is located between one of the bit lines and one of the second word lines, each of the lower memory cells including a first variable resistance element, a first ferromagnetic layer, a first insulating layer, a second ferromagnetic layer, a non-magnetic first metal layer, and a third ferromagnetic layer stacked in order in a third direction crossing the first and second directions such that the first variable resistance element is in contact with an upper surface of said one of the first word lines and said one of the bit lines is in contact with an upper surface of the third ferromagnetic layer, wherein the second ferromagnetic layer and the third ferromagnetic layer have magnetizations in opposite directions, and each of the upper memory cells including a second variable resistance element, a fourth ferromagnetic layer, a second insulating layer, a fifth ferromagnetic layer, a non-magnetic second metal layer, and a sixth ferromagnetic layer stacked in order in the third direction such that the second variable resistance element is in contact with an upper surface of said one of the bit lines and said one of the second word lines is in contact with an upper surface of the sixth ferromagnetic layer, wherein the fifth ferromagnetic layer and the sixth ferromagnetic layer have magnetizations in opposite directions, wherein each of the lower memory cells goes into a low resistance state in response to a current having at least a first magnitude flowing therethrough in a direction from the first word lines to the bit lines, and each of the upper memory cells goes into a low resistance state in response to a current of at least a second magnitude, which is larger than the first magnitude, flowing therethrough in a direction from the bit lines to the second word lines, and wherein each of the lower memory cells goes into a high resistance state in response to a current having at least a third magnitude flowing therethrough in a direction from the bit lines to the first word lines, and each of the upper memory cells goes into a high resistance state in response to a current of at least a fourth magnitude, which is smaller than the third magnitude, flowing therethrough in a direction from the second word lines to the bit lines.

12. The memory device according to claim 11, wherein the sixth ferromagnetic layer has a volume larger than a volume of the third ferromagnetic layer.

13. The memory device according to claim 12, wherein the sixth ferromagnetic layer includes a first portion that has substantially the same thickness as the third ferromagnetic layer and a second portion stacked on top of the first portion.

14. The memory device according to claim 12, wherein the second ferromagnetic layer and the third ferromagnetic layer are anti-ferromagnetically coupled, and the fifth ferromagnetic layer and the sixth ferromagnetic layer are anti-ferromagnetically coupled.

15. The memory device according to claim 14, wherein the first metal layer has a thickness that allows the second ferromagnetic layer and the third ferromagnetic layer to be anti-ferromagnetically coupled, and the second metal layer has a thickness that allows the fifth ferromagnetic layer and the sixth ferromagnetic layer to be anti-ferromagnetically coupled.

16. The memory device according to claim 15, further comprising:

a first sense amplifier circuit connected to each of the first word lines; and a second sense amplifier circuit connected to each of the second word lines.

17. The memory device according to claim 16, further comprising:

a first driver circuit configured to apply a first voltage to the first word lines, a second driver circuit configured to apply a second voltage higher than the first voltage to the bit lines, and a third driver circuit configured to apply a third voltage lower than the second voltage to the second word lines.

18. The memory device according to claim 17, wherein the first driver circuit includes a p-type first MOSFET connected between the first word lines and a node having a fourth voltage lower than the first voltage, and the third driver circuit includes a p-type second MOSFET connected between the second word lines and a node having the fourth voltage.

19. A memory device comprising:

a first conductor;

a first stacked body above the first conductor, the first stacked body including a first variable resistance element, a first ferromagnetic layer above the first variable resistance element, a first insulating layer above the first ferromagnetic layer, a second ferromagnetic layer above the first insulating layer, a non-magnetic first metal layer above the second ferromagnetic layer, and a third ferromagnetic layer above the non-magnetic first metal layer, wherein the second ferromagnetic layer and the third ferromagnetic layer have magnetizations in opposite directions;

a second conductor above the first stacked body;

a second stacked body above the second conductor, the second stacked body including a second variable resistance element, a fourth ferromagnetic layer above the second variable resistance element, a second insulating layer above the fourth ferromagnetic layer, a fifth ferromagnetic layer above the second insulating layer, a non-magnetic second metal layer above the fifth ferromagnetic layer, and a sixth ferromagnetic layer above the non-magnetic second metal layer, wherein the fifth ferromagnetic layer and the sixth ferromagnetic layer have magnetizations in opposite directions, and the sixth ferromagnetic layer has a volume larger than a volume of the third ferromagnetic layer; and a third conductor above the second stacked body.

* * * * *